(12) United States Patent
Wong et al.

(10) Patent No.: US 7,534,699 B2
(45) Date of Patent: May 19, 2009

(54) SEPARATING AND ASSEMBLING SEMICONDUCTOR STRIPS

(75) Inventors: Paul Charles Wong, West Pennant Hills (AU); Razmik Abnoos, Marsfield (AU); Vernie Allan Everett, Kaleen (AU); Mark John Kerr, Prospect (AU)

(73) Assignee: Origin Energy Solar Pty Ltd (AU)

( * ) Notice: Subject to any disclaimer, the term of this patent is extended or adjusted under 35 U.S.C. 154(b) by 0 days.

(21) Appl. No.: 10/552,316

(22) PCT Filed: May 7, 2004

(86) PCT No.: PCT/AU2004/000594

§ 371 (c)(1),
(2), (4) Date: Jun. 9, 2006

(87) PCT Pub. No.: WO2004/100252

PCT Pub. Date: Nov. 18, 2004

(65) Prior Publication Data

US 2007/0045831 A1    Mar. 1, 2007

(30) Foreign Application Priority Data

May 9, 2003 (AU) .............................. 2003902270

(51) Int. Cl.
*H01L 21/30* (2006.01)
(52) U.S. Cl. .................. 438/458; 438/455; 257/620
(58) Field of Classification Search .................. 438/458
See application file for complete search history.

(56) References Cited

U.S. PATENT DOCUMENTS

| | | | | |
|---|---|---|---|---|
| 4,443,652 A | * | 4/1984 | Izu et al. ..................... | 136/251 |
| 4,617,420 A | * | 10/1986 | Dilts et al. .................. | 136/244 |
| 6,106,222 A | * | 8/2000 | Tsuji et al. .................. | 414/811 |
| 6,231,673 B1 | * | 5/2001 | Maeda ........................ | 118/718 |
| 6,655,045 B2 | | 12/2003 | Cheung et al. | |
| 2004/0097012 A1 | * | 5/2004 | Weber et al. ................ | 438/113 |

FOREIGN PATENT DOCUMENTS

| | | |
|---|---|---|
| EP | 111394 A2 | 6/1984 |
| WO | WO 00/77860 A2 | 12/2000 |
| WO | WO 02/45143 A1 | 6/2002 |

OTHER PUBLICATIONS

Notification of the First Office Action for China 200480012557.1 issued Aug. 17, 2007.
Notification of the Second Office Action for China 200480012557.1 issued Jun. 6, 2008.

\* cited by examiner

*Primary Examiner*—M. Wilczewski
*Assistant Examiner*—Sonya D McCall Shepard
(74) *Attorney, Agent, or Firm*—Wood, Phillips, Katz, Clark & Mortimer

(57) ABSTRACT

A method and an apparatus for separating elongated semiconductor strips from a wafer of semiconductor material are disclosed. Vacuum is applied to the face of each semiconductor strip forming an edge of the wafer or being adjacent to the edge. The wafer and the source of the vacuum are displaced to separate each elongated semiconductor strip from the wafer. Further, a method and an apparatus for assembling elongated semiconductor strips separated from a wafer of semiconductor material into an array of strips are disclosed. Still further, methods, apparatuses, and systems for assembling an array of elongated semiconductor strips on a substrate are also disclosed.

9 Claims, 39 Drawing Sheets

SEPARATING AND ASSEMBLING SEMICONDUCTOR STRIPS

FIELD OF THE INVENTION

The present invention relates generally to semiconductor processing, and in particular to assembling arrays of semiconductor strips.

BACKGROUND

The photovoltaic solar cell industry is highly cost sensitive in terms of the efficiency of the voltage produced by a solar cell and the cost of producing the solar cell. As only a low percentage of the total thickness of a solar cell is used to generate voltage, it is increasingly important to minimise the thickness of the solar cell and yield more solar cells from a piece of silicon.

International (PCT) Publication No. WO 02/45143 (PCT/AU01/01546) published on 6 Jun. 2002 and entitled "Semiconductor Wafer Processing to Increase the Usable Planar Surface Area" describes "sliver" solar cells and a method of making such sliver solar cells to increase the usable surface area of a semiconductor wafer. The wafer has a substantially planar surface and a thickness dimension at a right angle to the substantially planar surface and is typically single crystal silicon or multicrystalline silicon.

In the method of International Publication No. WO 02/45143, a strip or sliver thickness is selected for division of the wafer into several strips or slivers. A technique is then selected for cutting the wafer into the strips at an angle to the substantially planar surface, in which the combined strip thickness and width of wafer removed by the cutting is less than the thickness of the wafer. The wafer is cut into strips using the selected technique, and the strips are separated from each other. The faces of the strips that were previously at an angle to the surface of the wafer become the faces of the strips exposed as a result of cutting the wafer and separating the strips from each other.

FIG. 1(a) illustrates a silicon wafer 3 formed by standard crystal growth and wafering techniques. The wafer 3 may be at least 0.5 mm thick and typically about 1 mm thick and can be single-crystal or a multi-crystalline wafer. In the method of International Publication No. WO 02/45143, a series of parallel channels or slots 2 is formed in the wafer 3. The slots are typically 0.05 mm wide, and the pitch of the slots is typically 0.1 mm. In this manner thin parallel strips of silicon 1 are formed, about 0.05 mm wide. Because the slots 2 do not extend all the way to the edges of wafer 3, a frame 5 of uncut silicon holds the strips 1 in place. Frame 5 is typically 5 mm wide on each side. Slots 2 may be formed using any of a number of techniques, including those referred to in International Publication No. WO 02/45143.

FIG. 1(b) is an enlarged vertical cross-section through the wafer 3 along line A-A showing strips 1 and spaces 2 in cross-sectional view.

FIG. 2 illustrates an arrangement of strips or slivers fabricated as solar cells 20 with a parallel connection and a gap between cells. The cells 20 are arranged on a substrate 21 as shown. Electrically conductive tracks 16 may be formed, for example, so that all the p polarity contacts 32 are electrically connected together at one end of the cells, while the n polarity contacts 33 are electrically connected together at the other end of the cells.

As the strips or slivers of semiconductor readily warp and bend but at the same time are quite brittle, the slivers disadvantageously may fracture or be damaged when separated from the wafer. Further, the faces of all slivers must all be configured with the same face as shown as cells 20 in FIG. 2, or differences in polarity may occur. Still further, the slivers may disadvantageously stick together.

Therefore, a need exists for separating strips or slivers of semiconductor material from wafers and assembling those separated strips or slivers.

SUMMARY

In accordance with an aspect of the invention, there is provided a method of separating elongated semiconductor strips from a wafer of semiconductor material. A plurality of elongated semiconductor strips formed in a wafer in a substantially parallel manner with respect to each other are provided. The wafer has a substantially planar surface and a thickness dimension at a right angle to the substantially planar surface. The wafer also has a frame portion(s) at opposite ends of the semiconductor strips connecting the strips to the wafer. The semiconductor strips each have a width at least substantially equal to the wafer thickness and a thickness dimension of the strip less than the width. At least one of the elongated semiconductor strips lengthwise forms an edge of the wafer or being nearest adjacent the edge. A vacuum is applied to the elongated semiconductor strip forming the edge or being adjacent to the edge. This elongated semiconductor strip is pulled down to the vacuum source. The wafer is displaced away from the vacuum source leaving the elongated semiconductor strip free of the wafer and still engaged on the vacuum source.

In accordance with another aspect of the invention, the described operation can be performed simultaneously on multiple wafers, thus separating multiple elongated semiconductor strips at the same time.

In accordance with yet another aspect of the invention, there is provided a method of assembling a plurality of elongated semiconductor strips separated from a wafer of semiconductor material into an array of the strips. One of the elongated semiconductor strips is received at a predetermined position of at least one belt oriented lengthwise across the belt. The belt is moved in a given direction by a predetermined distance greater than the width of the elongated semiconductor strip. The receiving and moving steps are repeated until all of the elongated semiconductor strips have been processed.

In accordance with a further aspect of the invention, there is provided a method of assembling an array of elongated semiconductor strips on a substrate. Adhesive material is deposited on the substrate in a predetermined manner. Vacuum is applied to each one of the elongated semiconductor strips to maintain the strips in the array. The array is a predefined arrangement of the strips. The array of elongated semiconductor strips is transferred to the substrate, and a face of each elongated semiconductor strip is brought into contact with a portion of the adhesive material. The vacuum applied to each elongated semiconductor strip is reduced or ceased, to provide the array of elongated semiconductor strips located in situ on the substrate and adhering to the substrate.

In accordance with still another aspect of the invention, there is provided a method of assembling an array of elongated semiconductor strips on a substrate. The elongated semiconductor strips are formed in a wafer in a substantially parallel manner with respect to each other. The wafer has a substantially planar surface and a thickness dimension at a right angle to the substantially planar surface. The wafer has a frame portion(s) at opposite ends of the semiconductor strips connecting the strips to the wafer. An elongated semiconductor strip is separated from the wafer using vacuum applied to the elongated semiconductor strip forming an edge or being adjacent to an edge of the wafer. The wafer is displaced from a source of the vacuum relative by a predetermined distance. The elongated semiconductor strip is received on at least one first belt oriented lengthwise across the belt. The at least one first belt is moved in a given direction by a predetermined distance greater than the width of the elongated semiconductor strip. The foregoing steps are repeated until all of the elongated semiconductor strips have been processed.

In another aspect of the invention, there is provided a device, comprising a substrate, an array of elongated semiconductor strips, adhesive material, and electrically conductive material. The elongated semiconductor strips are separated from a wafer of semiconductor material, and each has a width substantially equal to the wafer thickness and a thickness dimension of the strip less than the width. The adhesive material is deposited between the substrate and a face of each elongated semiconductor strip to adhere the substrate and each elongated semiconductor together. The face has the width of the elongated semiconductor strip as one of its dimensions. The electrically conductive material is deposited on the substrate connecting at least two of the elongated semiconductor strips together.

In accordance with further aspects of the invention, there are provided apparatuses and systems for implementing the methods in accordance with the foregoing aspects of the invention. These and other aspects of the invention are set forth hereinafter

BRIEF DESCRIPTION OF THE DRAWINGS

Embodiments of the invention are described, by way of example only, with reference to the accompanying drawings, in which.

DETAILED DESCRIPTION

A method and an apparatus are disclosed for separating elongated semiconductor strips from a wafer of semiconductor material. Further, a method and an apparatus are disclosed for assembling a plurality of elongated semiconductor strips separated from a wafer of semiconductor material into an array of the strips. Still further, a method and an apparatus are disclosed for assembling an array of elongated semiconductor strips on a substrate. In the following description, numerous specific details, including semiconductor strip or sliver dimensions, the number of belts, spacings between belt castellations, and the like are set forth. However, from this disclosure, it will be apparent to those skilled in the art that modifications and/or substitutions may be made without departing from the scope and spirit of the invention. In other circumstances, specific details may be omitted so as not to obscure the invention.

The embodiments of the invention seek to yield more cell surface area per mass of silicon.

Overview

Figure 11:
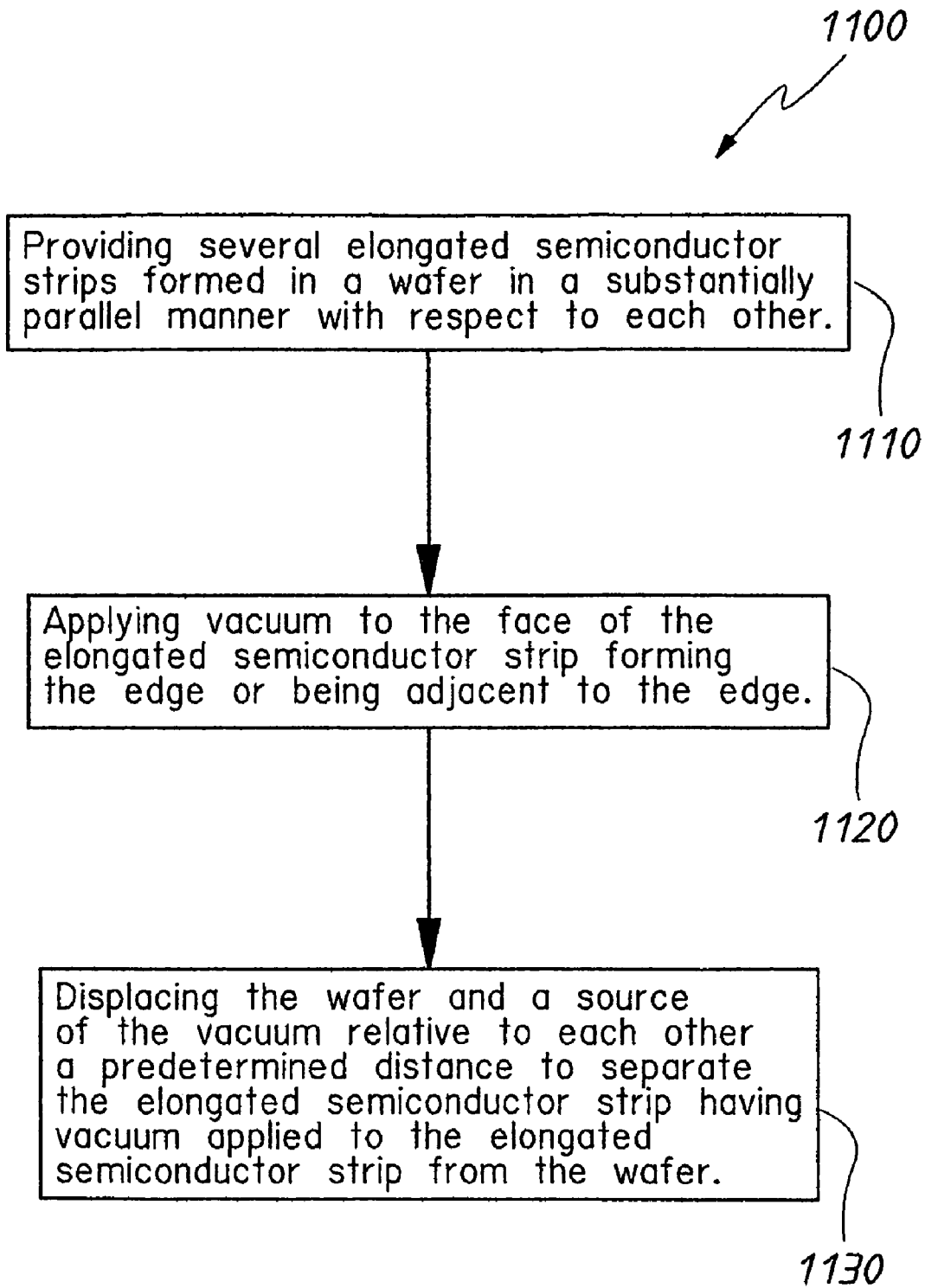
FIG. 11 is a flow diagram illustrating a process of separating strips or slivers from a wafer of semiconductor material.

FIG. 11 is a flow diagram illustrating a process 1110 of separating strips or slivers from a wafer of semiconductor material in accordance with an embodiment of the invention. The strips are elongated in shape. Preferably, the wafer is single crystal silicon or multi-crystalline (or poly-crystalline) silicon. However, other semiconductor materials may be practiced without departing from the scope and spirit of the invention. In step 1110, several elongated semiconductor strips formed in a wafer in a substantially parallel manner with respect to each other are provided. The wafer has a substantially planar surface and a thickness dimension at a right angle to the substantially planar surface. The wafer also has one or more frame portions at opposite ends of the semiconductor strips connecting the strips to the wafer. The semiconductor strips each have a width at least substantially equal to the wafer thickness and a thickness dimension of the strip less than the width. A face of at least one of elongated semiconductor strips lengthwise forms an edge of the wafer or is nearest adjacent the edge. The wafer may be moved so that the face of the elongated semiconductor strip is in close proximity to the source of the vacuum. In step 1120, vacuum is applied to the face of the elongated semiconductor strip forming the edge or being adjacent to the edge. In step 1130, the wafer and a source of the vacuum are displaced relative to each other a predetermined distance to separate the elongated semiconductor strip having vacuum applied to the elongated semiconductor strip from the wafer.

The vacuum applied to the separated, elongated semiconductor strip is reduced and is preferably terminated (i.e., the vacuum ceases) and the separated, elongated semiconductor strip and the source of the vacuum are displaced relative to each other.

In a variation of this step, vacuum may continue to be applied to the elongated semiconductor strip while the strip is being displaced relative to the wafer, in order to maintain the elongated semiconductor strip in close contact with the displacement means. This vacuum engagement may be maintained until the elongated semiconductor strip is under other retention means such as at least one roof bar.

The steps of the method are repeatedly performed to separate two or more of the elongated semiconductor strips from the wafer. The source of the vacuum has a body with at least one cavity formed in the body for providing the applied vacuum. The cavity adjacent the face of the elongated semiconductor strip is substantially the same in size as or smaller than a dimension of the face. Specific embodiments of vacuum sources, or vacuum blocks, are set forth hereinafter.

The elongated semiconductor strip may be formed with preferred points of breakage from the wafer. These can be weak points in portions of the wafer adjacent opposite ends of the elongated semiconductor strips. The weak points facilitate separation of the elongated semiconductor strip from the wafer. More preferably, the weak points are grooves formed in the wafer using any of a number of well-known techniques, including sawing and etching. Other methods of forming such weak points may be practiced without departing from the scope and spirit of the invention.

When the elongated semiconductor strip breaks away from the wafer at these weak points, control the manner of breakage is desirable. A mechanism for providing a manner of breakage is to control the crystal fracture plane's orientations.

Preferably, the elongated semiconductor strips are utilized to form "sliver" photovoltaic solar cells. However, similarly configured semiconductor slivers or strips may be used to form other devices and circuits.

In the following description, embodiments of the invention are disclosed in detail utilising pairs of belts with castellations. However, the methods, apparatuses and systems may be practiced with other numbers of belts and configurations. For example, the methods, apparatuses and systems may be implemented using a single belt for each pair of belts described in detail below. Further, the belt may have grooves formed in it rather than castellations. For example, each belt may be porous to allow vacuum action through it, or the belt may have openings, have perforations, be woven, or the like, to enable use with the vacuum source. Another variation is that the "belts" may be carrier strips that are used as part of the assembly of the final solar panel. Other variations may be practiced without departing from the scope and spirit of the invention.

Otherwise, the collation of the elongated semiconductor strips may be performed on a batch basis, where the castellations are on one or more carrier bars.

Wafers with Slivers

Figure 1:
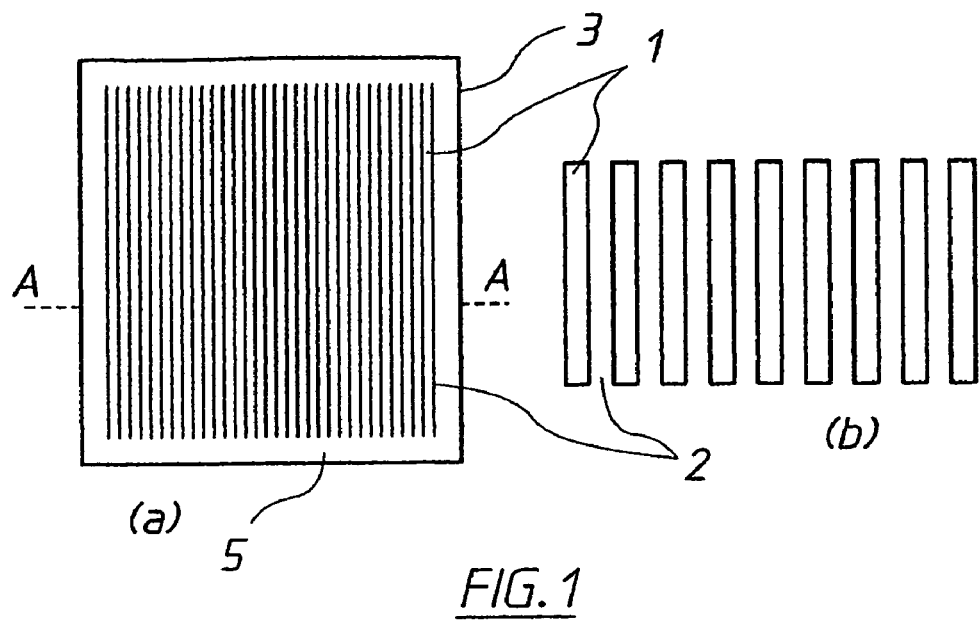
FIGS. 1(*a*) and 1(*b*) are a schematic diagram showing top and cross sectional views of a semiconductor wafer following the formation of slots.
Figure 2:
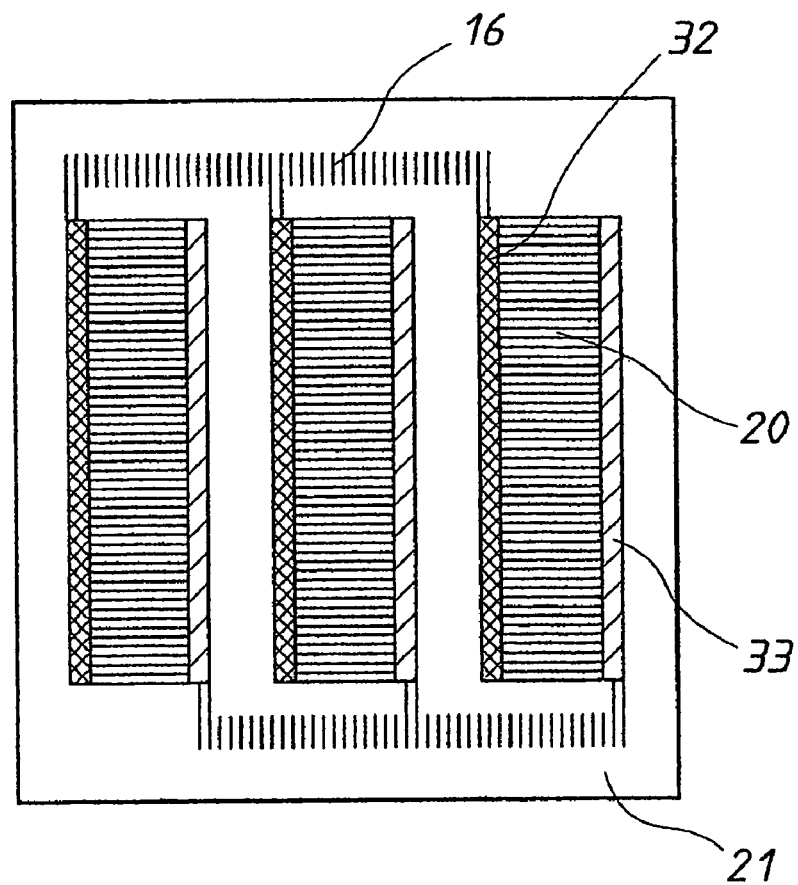
FIG. 2 is a schematic diagram illustrating the arrangement of semiconductor strips or slivers and their electrical interconnection.
Figure 3A:
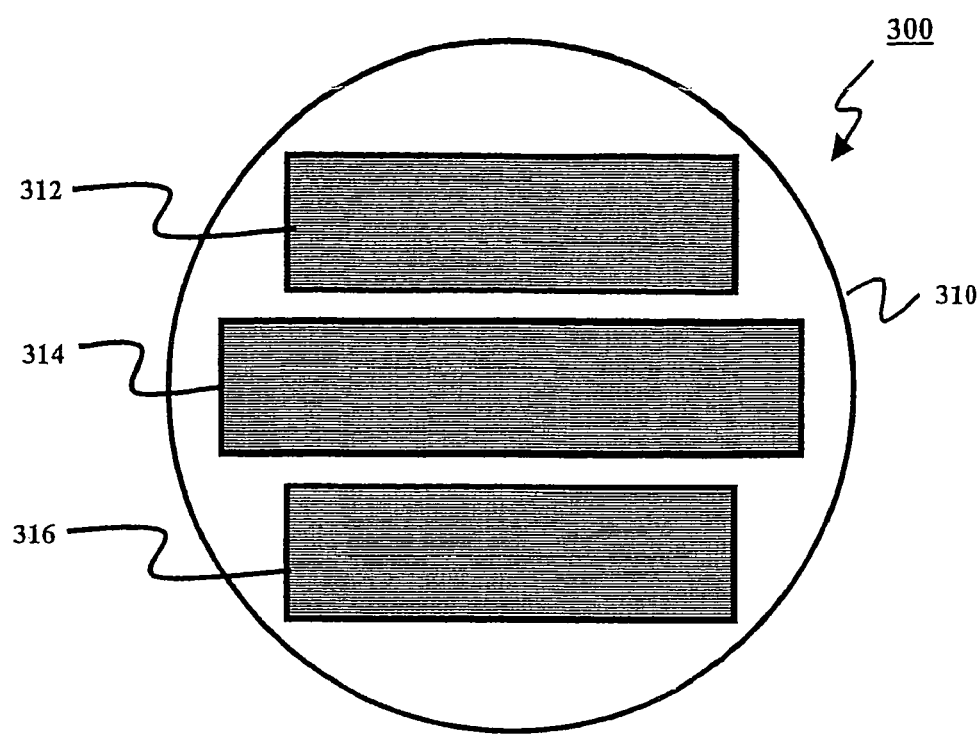
FIGS. 3(*a*) to 3(*d*) are schematic diagrams illustrating a semiconductor wafer having one or more regions of strips or slivers formed in the wafer.
Figure 3B:
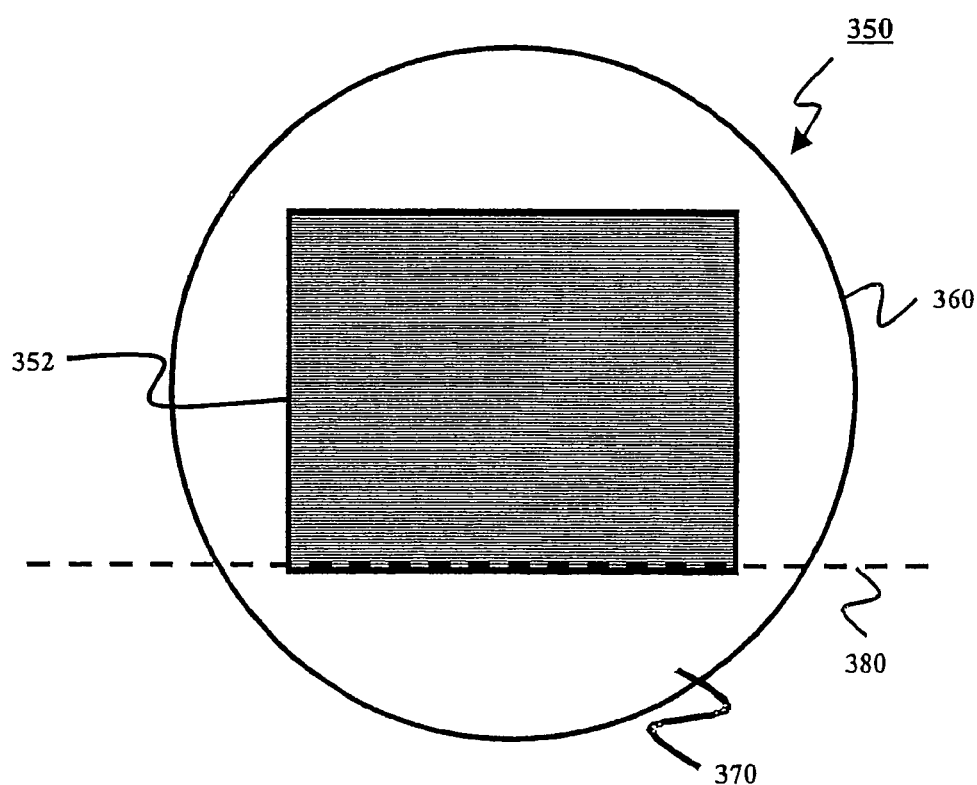

FIGS. 3(a) and 3(b) are schematic diagrams illustrating semiconductor wafers having at least one region of strips or slivers formed in the wafer. Hereinafter, such strips of semiconductor cut in the wafer are referred to as "slivers" for ease of description. A first configuration 300 of a semiconductor wafer 310 with several sliver portions 312, 314, 316 is depicted in FIG. 3(a). As can be seen from the FIG. 3(a), the portion 314 has slivers that are significantly longer than those of regions 312 and 316. Separate processes may be practiced to process the different length slivers, although essentially the same steps and equipment are utilized.

Figure 3C:
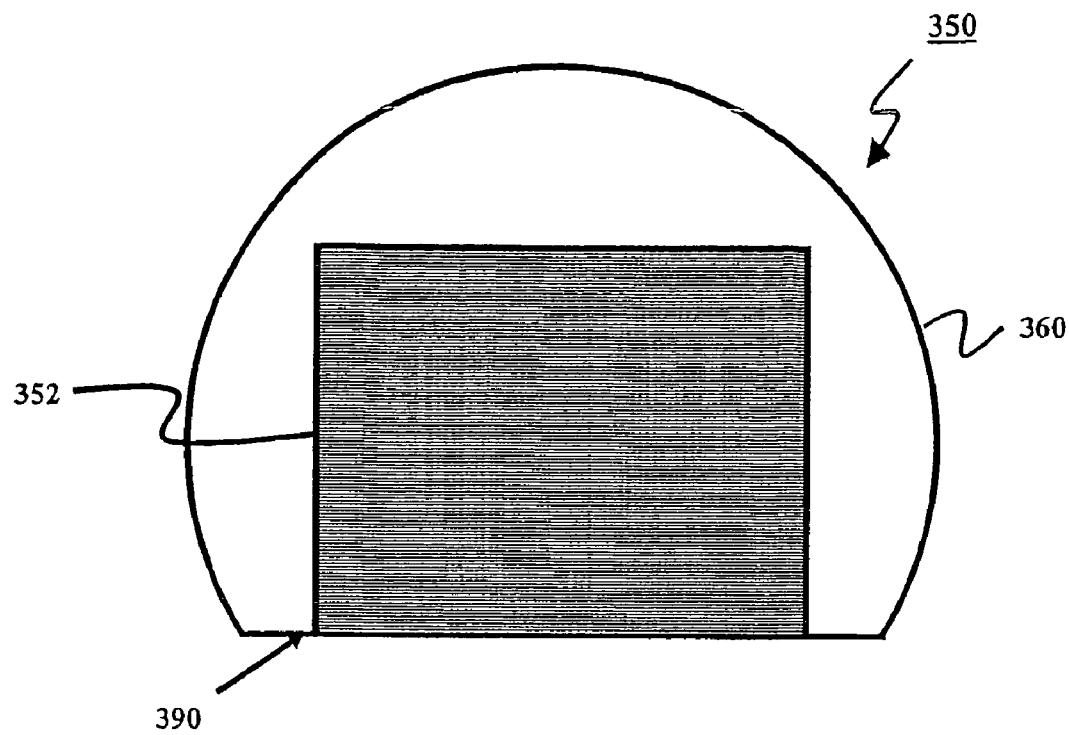
Figure 3D:
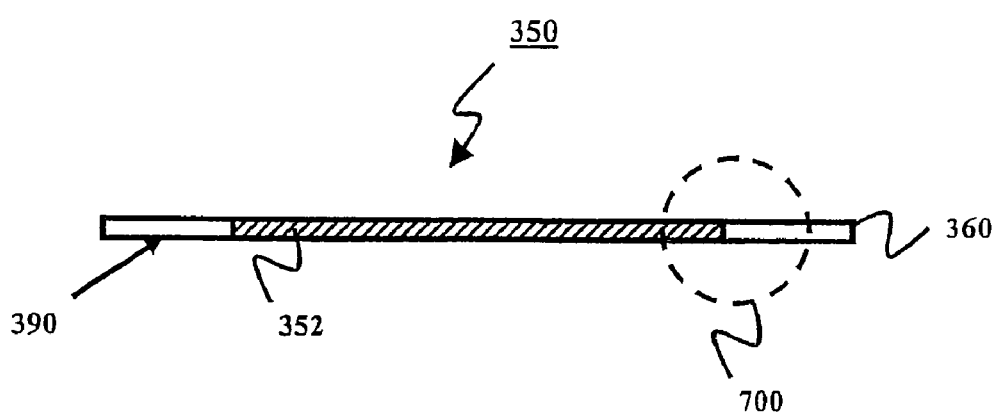

For ease of description, another configuration 350 is depicted in FIG. 3(b). A larger, single portion 352 of slivers characterizes this wafer 360 (otherwise identical to that 310 of FIG. 3(a)). A portion 370 of the wafer 360 is removed from the wafer 360 along the dashed line 380 using any of a number of well-known techniques. A face of at least one of elongated semiconductor strips lengthwise forms an edge of the wafer or is nearest adjacent the edge. FIG. 3(c) shows the resulting configuration of the wafer 360 having a flat or straight edge 390. A frame(s) of uncut wafer material surrounds the slivers portion 352. A face of one of the slivers (i.e., an elongated semiconductor strip) lengthwise forms the edge 390 of the wafer 360 or is nearest adjacent the edge 390. The latter would be the case if slivers are progressively removed from the edge 390. FIG. 3(d) is an elevation view showing the thickness of the wafer 360, with one sliver 352 (indicated by diagonal hashing) forming part of the edge 390, or being adjacent thereto. A dashed circle 700 indicates a portion of the wafer where the sliver 352 is connected to a frame portion of the wafer 360 and is shown in an enlarged view in FIG. 7.

While the slivers in FIG. 3(c) are shown formed at substantially right angles to the planar surface of the wafer, this need not be the case. For example, the slivers may be formed (e.g., etched) at an angle different than ninety degrees to form slivers that are wider than the thickness of the wafer. Thus, the width of a sliver may be at least substantially equal to the thickness of the wafer. This covers the case where the width is slightly less than the thickness of the wafer, equal to the thickness, or greater than the thickness of the wafer.

Figure 7:
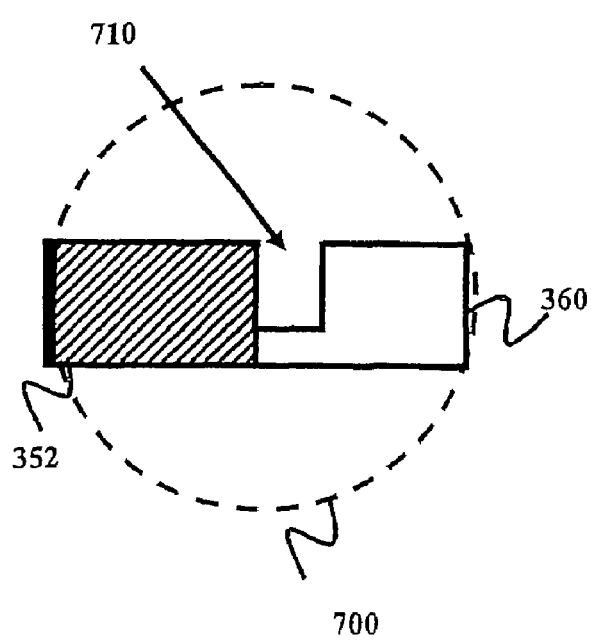
FIG. 7 is a schematic diagram illustrating a weakened region of the wafer shown in FIG. 3(*d*)

As shown in FIG. 7, the circle 700 shows an enlarged portion of the wafer 360. A weakened portion 710 is formed in the region between the sliver 352 (diagonal hashing) and the frame (solid white). The weakened portion 710 is preferably a groove formed by sawing and may be 50% of the width of the face of the sliver 352, and may be larger (e.g., 60%). Such weakened portions 710 may be formed at opposite ends of the slivers connected with the frame(s). Other techniques including etching may be practiced to form the weakened portions.

Figure 4:
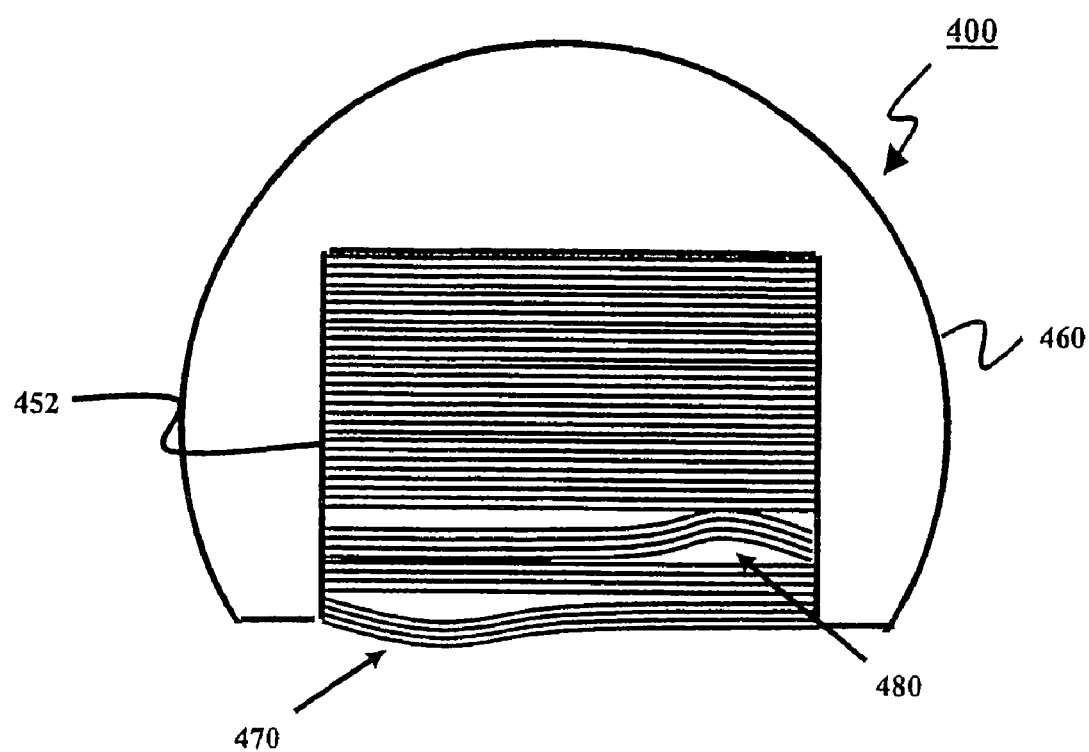
FIG. 4 is a schematic diagram illustrating a semiconductor wafer having a region of strips or slivers that are unevenly spaced or warped in the wafer due to flexibility of the strips or slivers.
Figure 12:
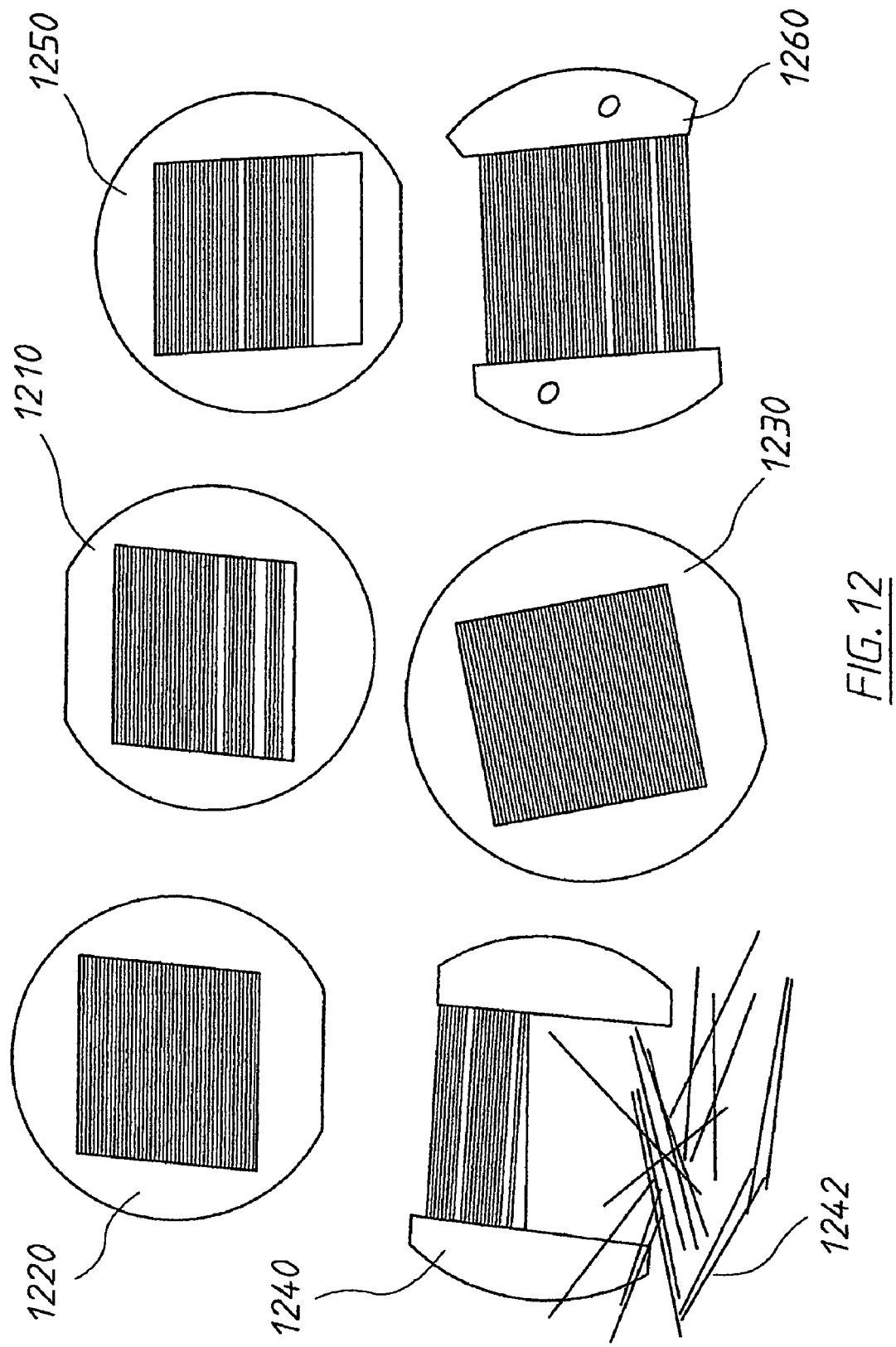
FIG. 12 is an image showing six wafers with slivers formed in each of the wafers.

While the slivers 352 shown in FIGS. 3(a) to 3(d) have been depicted as substantially straight or flat, the gaps formed between slivers may and frequently do produce deflections or warping of the slivers. For example, several slivers may be warped to as to have an S-shape lengthwise. The slivers may also stick together, or portions of slivers may break off from the wafer. FIG. 4 is a schematic diagram illustrating the configuration 400 of a semiconductor wafer 460 having a region 452 of slivers, including slivers 470 and 480 that are unevenly spaced or warped in the wafer 460 due to flexibility of the slivers. The displacement or warping 470, 480, the thickness of the slivers, and the spaces between slivers are exaggerated in the Figure for purposes of illustration. FIG. 12 is an image showing six actual wafers 1210, 1220, 1230, 1240, 1250, and 1260 with slivers formed in each of the wafers, with which embodiments of the invention may be practiced. The wafer 1230 has a portion of slivers that are regularly spaced. The wafers 1240 and 1260 have had a portion of the wafer removed to form an edge with slivers adjacent to the edge. Several of the slivers 1242 of the wafer 1240 have fragmented from the wafer 1240 indicating the brittleness and the fragility of slivers when handled. The wafer 1220 clearly shows a number of slivers formed in the wafer 1220 that are warped or deflected (i.e., having a wave-like shape with irregular gaps), as indicated in FIG. 4. The wafers have weak points formed in portions of the wafers adjacent opposite ends of the slivers to facilitate separation of the slivers from the wafer. This may be done using sawing, or etching, or any of a number of other techniques. Again, the wafers are preferably single crystal silicon or multicrystalline silicon, but may be other types of semiconductors.

Vacuum Source

Figure 5:
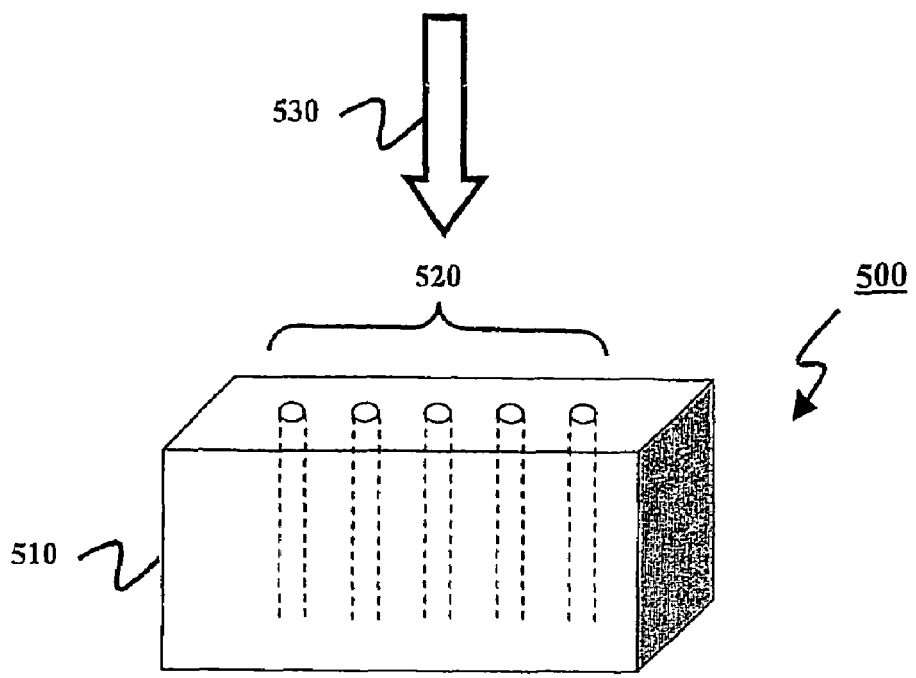
FIG. 5 is a block diagram of a vacuum source with which embodiments of the invention may be practiced.

The process 1100 of FIG. 11 advantageously uses a vacuum source to apply vacuum to a sliver to separate the sliver from the wafer. Steps 1120 and 1130 use the vacuum. FIG. 5 is a generic depiction of a vacuum source 500. The vacuum source 500 includes a solid body 510, which may be rectangular in form. The body 510 has one or more channels 520 formed through the body 510. The channels 520 may be cylindrical or prismatic in form (indicated with dashed lines) with a circular or substantially circular orifice in the topmost surface of the source 500. More preferably, the vacuum source is a shaped vacuum block. Still further, while the channels 520 are cylindrical in form with circular orifices, it will be appreciated by those skilled in the art that other configurations of the block and channels may be practiced without departing from the scope and spirit of the invention. For example, the block may be circular, rather than rectangular in form. Still further, the channels 520 may be rectangular in form with square orifices rather than cylindrical in form with circular in form, for example. Many variations may be practiced provided that sufficient vacuum is created to separate a sliver in contact with the vacuum source 500 from the wafer. Vacuum pulls the sliver downwardly toward the vacuum source 500, as indicated by arrow 530. This is done by applying suction to the bottom surface of the block 510. Further details of vacuum sources and their equivalents are set forth hereinafter.

Figure 35:
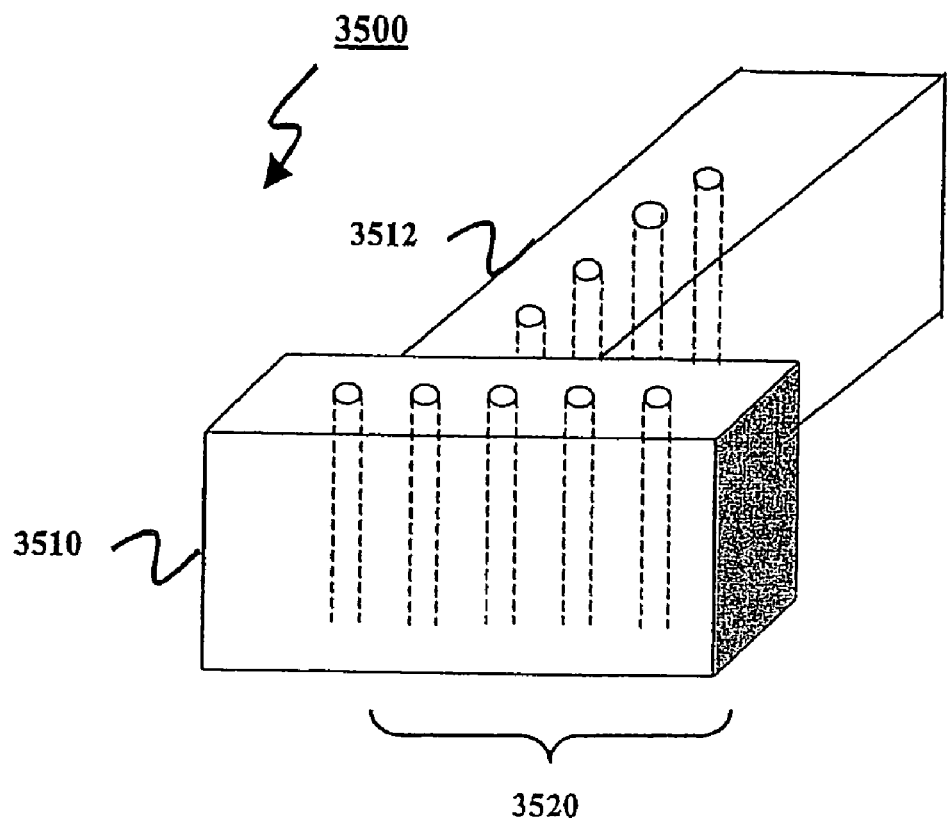
FIG. 35 is a block diagram of a vacuum source with which embodiments of the invention may be practiced.
Figure 36:
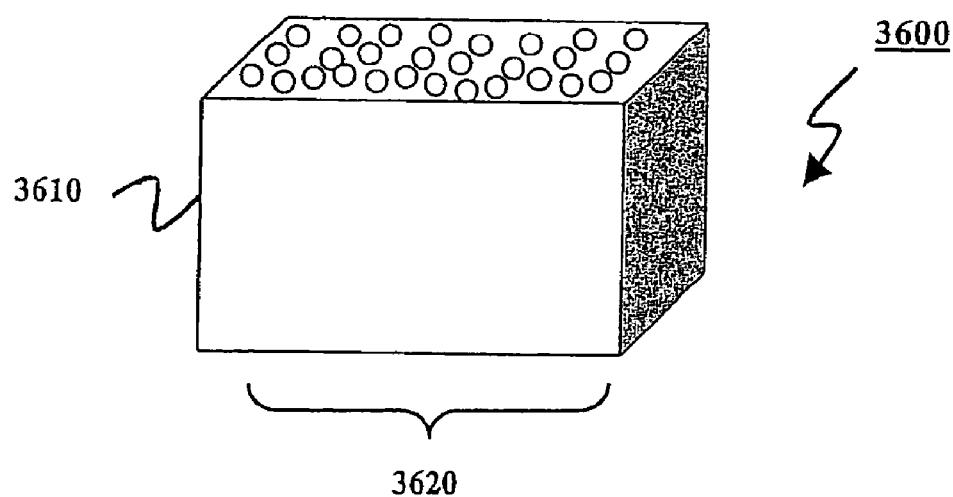
FIG. 36 is a block diagram of a vacuum source that has channels formed in a U-shaped configuration.
Figure 37:
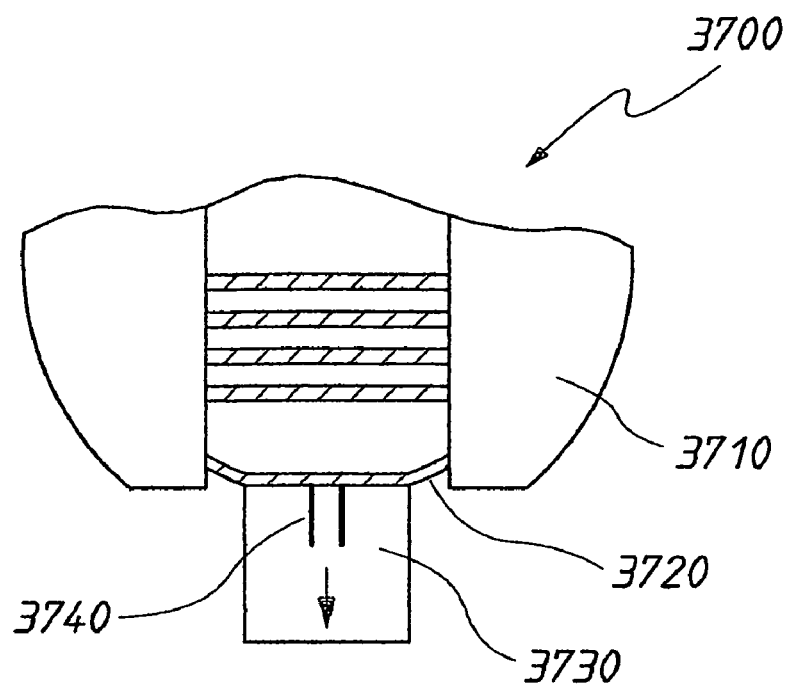
FIG. 37 is a block diagram of a sliver being removed from a wafer using a vacuum block having a vacuum sensor.
Figure 41:
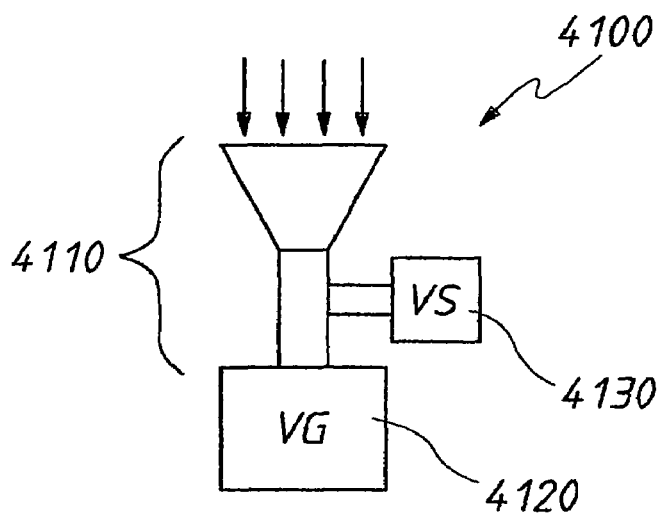
FIG. 41 is a block diagram of a vacuum sensor.

FIG. 35 is a block diagram of another vacuum block 3500 that may be practiced. This block 3500 may be Tee shaped, comprising a first block 3510 and a second block 3512 oriented transverse to the first one 3510. The block 3500 may be unitary, or comprise two or more separate pieces. The second block 3512 provides vacuum continuously via two or more channels 3520 formed through the body 3512 while the slivers are moved away from the first block 3510 by conveyors. Similar channels are in the block 3510. While a linear arrangement of channels 3520 is shown in each of blocks 3510, 3512, other configurations may be practiced. For example, the channels 3520 may be configured so as to appear E- or U-shaped when viewed in plan. Further the arrangement of E- or U-shapes may be staggered to give effectively continuous vacuum in conveying slivers. FIG. 36 shows a portion of a vacuum block 3600 that has U-shaped channels 3620 formed in the body 3610, and slightly staggered pitch between adjoining U-shaped channel configurations In yet another variation, the vacuum block may be provided with a vacuum sensor, such as the one 4100 shown in FIG. 41. The vacuum block has one or more channels 4110, coupled to a vacuum generator 4120 and a vacuum sensor 4130, which senses the vacuum produced when a sliver is brought into contact with an opening of the channel 4110. Upon a predetermined vacuum level being reached, the vacuum sensor 4130 actuates a retracting arm holding the wafer and then advances the belts. The vacuum level at which the retracting arm is actuated may be set at a variable preset value (e.g., at 0.5 to 0.7 bar, negative pressure). The vacuum level required is a function of hole size, number of holes, and hole spacing in the vacuum block. For any given vacuum block configuration, the vacuum level is adjusted so that the sliver is retained on the block during retraction of the wafer, but not held so tightly that the sliver is damaged when the sliver is moved off the block by the advancing conveyor belts. This can be better understood with reference to FIG. 37. The arrangement 3700 includes a wafer 3710, which includes slivers 3720. The lowermost sliver 3720 is brought into proximity with the vacuum block 3730 with sensor 3740.

Figure 39:
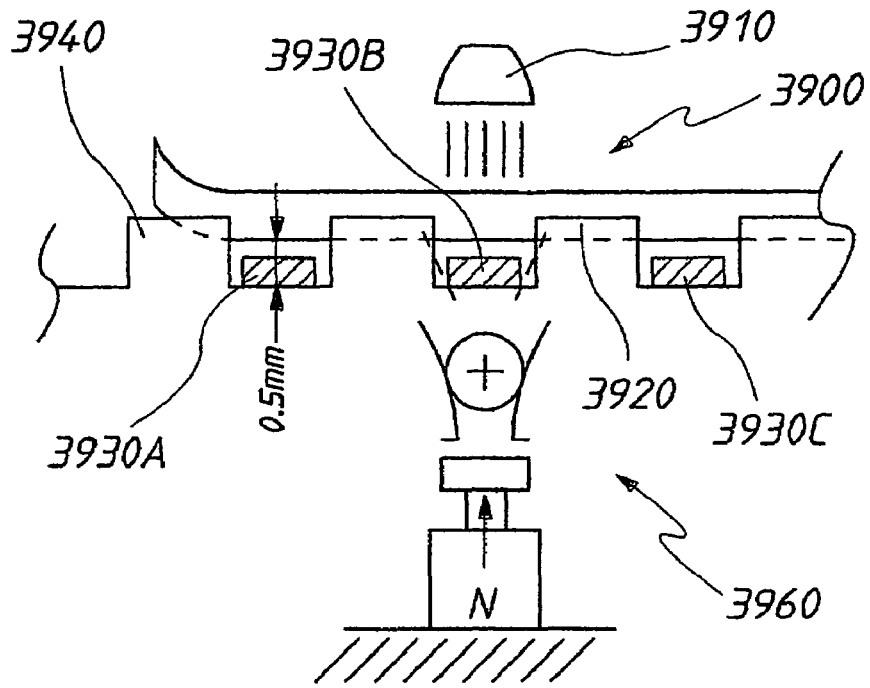
FIG. 39 is a block diagram of a "soft clasp" tester with a servo motor and cam.
Figure 40:
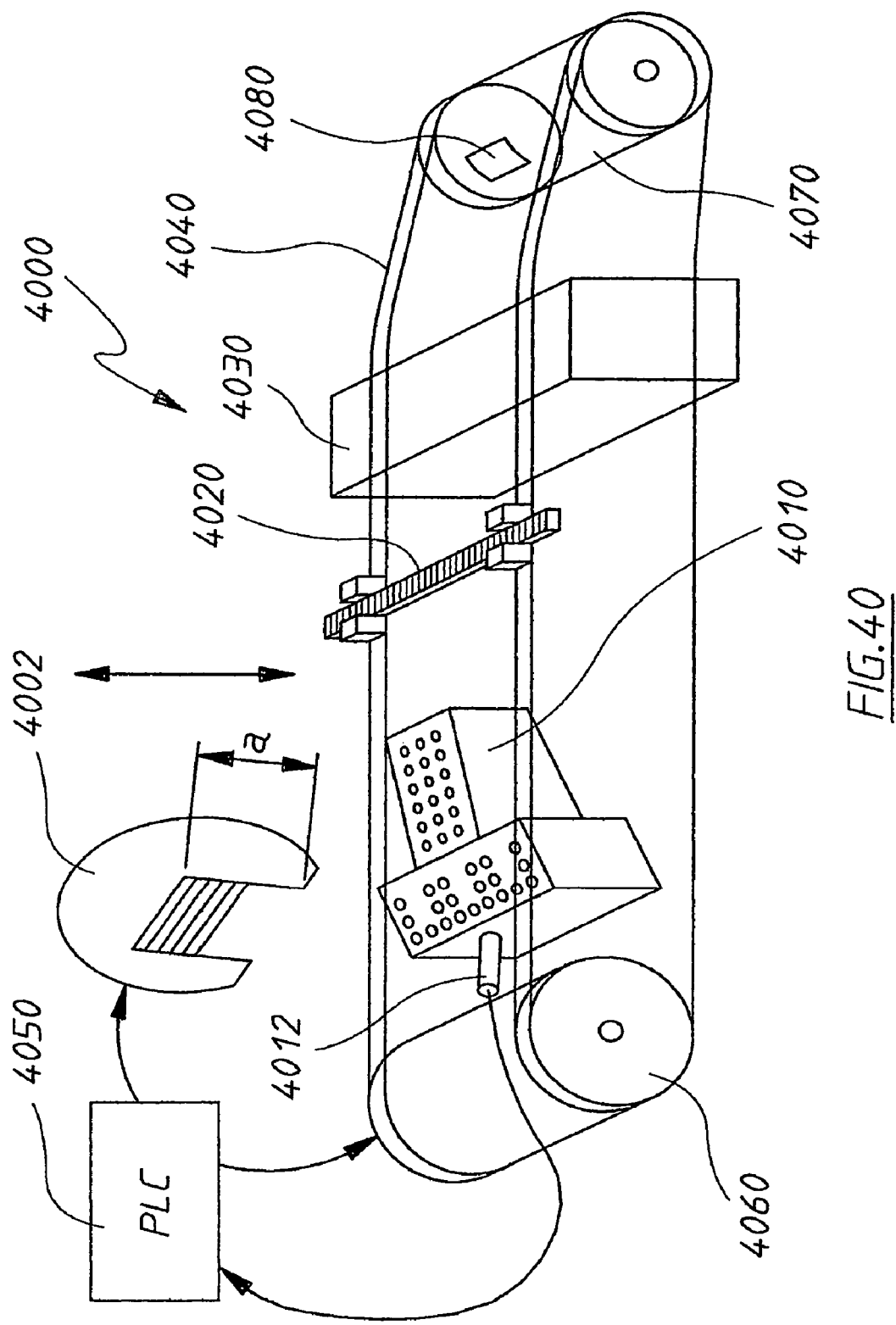
FIG. 40 is an arrangement of a vacuum source, castellated belts, tester, and vacuum drum in accordance with another embodiment of the invention.

As shown in FIG. 40, the sensor 3740, 4012 may be coupled to a programmable logic controller (PLC) 4050, or a similar controller, which in turn controls operation of the retracting arm (not shown) holding the wafer 4002 and conveyor belts 4040. In this embodiment, the vacuum source 4010 may be always on. Optionally, the vacuum sensor 4012 may detect if a broken sliver fragment is left behind on the vacuum block 4010 and trigger an alarm for the fragment to be removed. Slivers 4020 are placed between castellations in the belt 4040. Once vacuum is applied to the sliver 3720 of FIG. 37, the conveyor belt (not shown in FIG. 37, but see FIG. 40) is advanced by one pitch. When lowering the wafer 3710 toward the block 3730, the PLC may count the number of strips removed, moving the wafer in half steps, before retracting the wafer 3710 when a vacuum level is detected by the sensor. The vacuum drum 4070 is a transfer drum and may include a sensor to confirm the presence of a sliver. Both the fix mounted vacuum source and the vacuum sensor are connected to the rotating vacuum drum 4070 by a rotary connector mechanism well known to those familiar with the art. The arrangement 4000 may also include a tester module (see FIG. 39) and a mechanism for handling rejected slivers.

Figure 38:
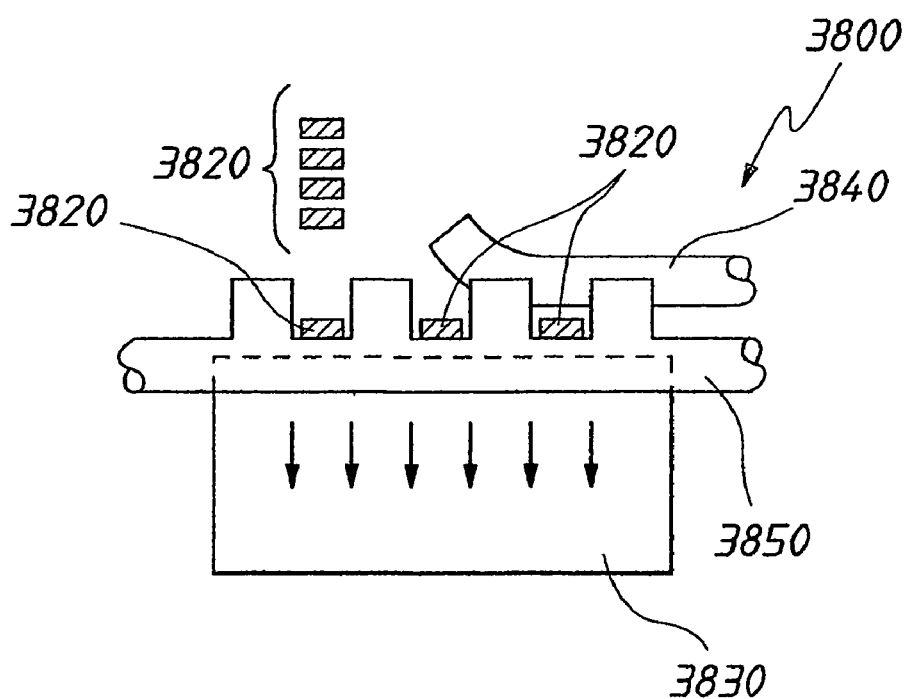
FIG. 38 is a block diagram illustrating placement of slivers onto castellated conveyor belts using the vacuum block of FIG. 37.

FIG. 38 shown a vacuum block 3830 located between castellated conveyor belts 3850, with slivers 3820 between the castellations. For ease of depiction, the slivers 3820 oriented in a vertical manner depict the same in a wafer, but the wafer is not shown. A skid or roof 3840 is located between the belts 3850 to ensure that slivers 3820 do not flip or rotate.

In yet another variation of the vacuum source 3500 shown in FIG. 35, the first block 3510 may operate in an on-off manner for removing a sliver from the wafer, while the second block 3512 may be always on.

Screws may be used to remove dags in the wafer from breaking slivers from wafer.

Separating Slivers from Wafer Using Vacuum Source

FIGS. 6(a) to 6(d) are schematic diagrams depicting the process of separating slivers from the semiconductor wafer 460 of FIG. 4. Again, the slivers portion 452 contains a number of warped or deflected slivers. While not shown in the Figure, slivers may also be broken partially or entirely from the wafer 460. The vacuum source 500 (body 510 with channels 520) is initially displaced by a predetermined distance relative to a sliver 630 forming the edge of the wafer 400.

Figure 6A:
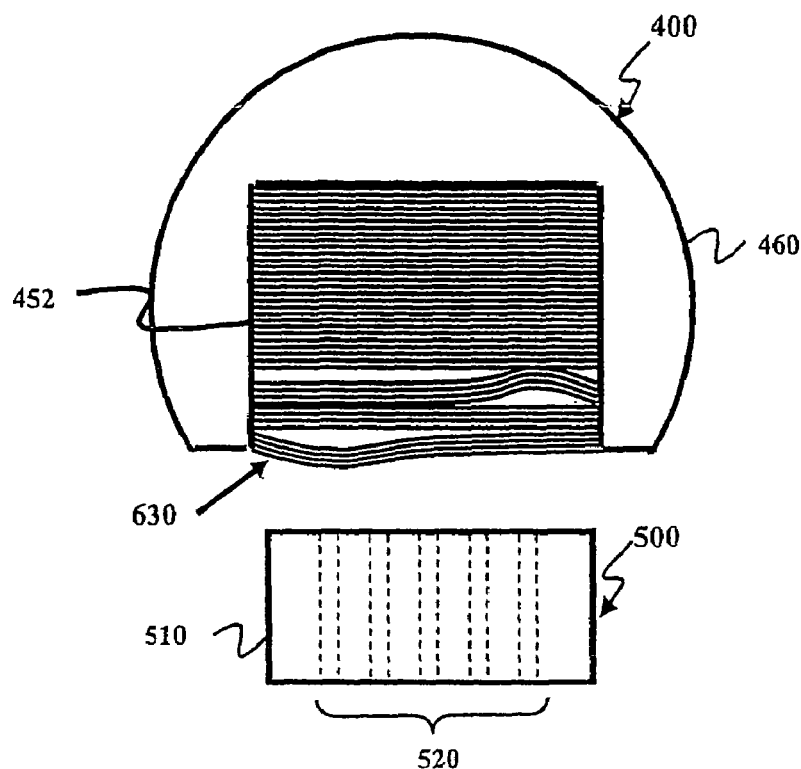
FIGS. 6(*a*) to 6(*d*) are schematic diagrams illustrating a process of separating strips or slivers from the semiconductor wafer of FIG. 4.
Figure 6B:
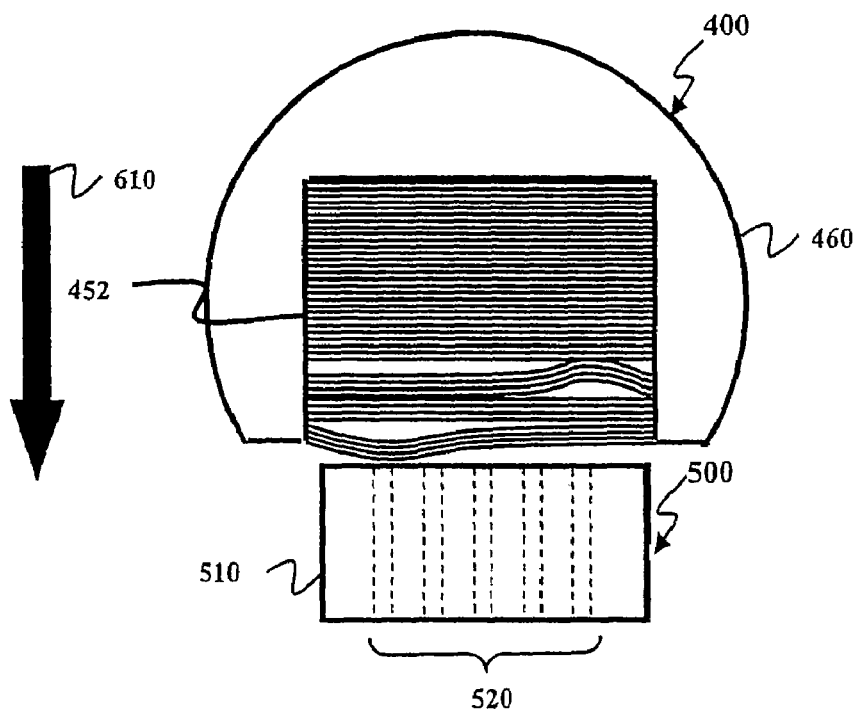
Figure 6C:
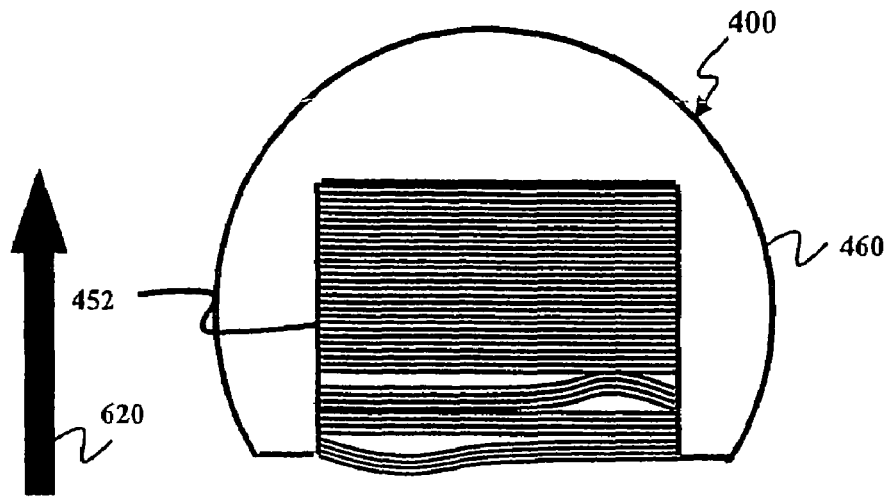
Figure 6D:
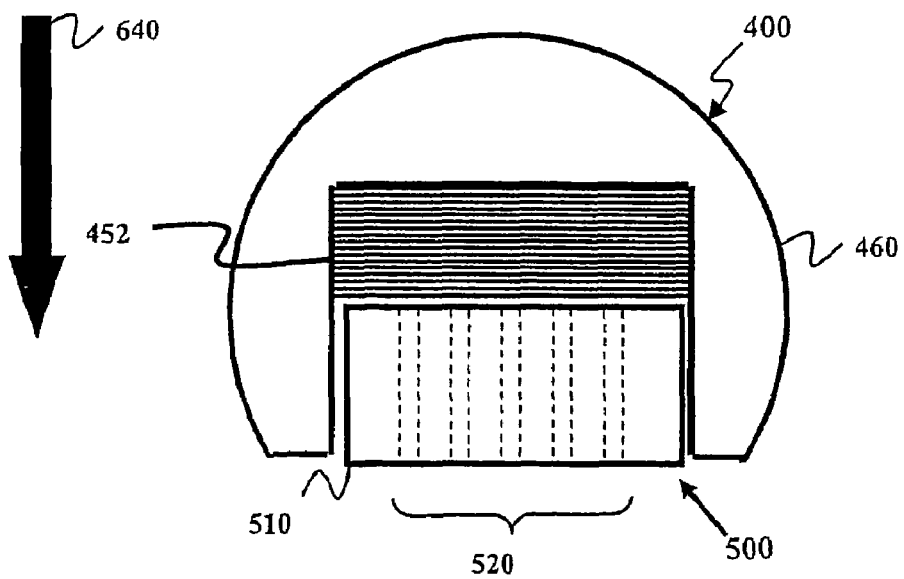

In one embodiment as depicted in FIG. 6(b), the wafer 400 is moved toward the vacuum source 500, as indicated by arrow 610, so that the edge of the wafer abuts or is in close proximity to the vacuum source 500. In an alternative embodiment, the vacuum source 500 may be moved so that it abuts or is adjacent to the wafer 400, rather than moving the wafer 400. Vacuum is then applied so that a face of the vacuum source having the orifices fastens the sliver 630. Sensors can be used to confirm this action. The wafer 400 and the vacuum source 500 are then displaced a predetermined distance, so that the weakened portions 710 of FIG. 7 snap or break and the sliver 630 is separated from the wafer 400. As shown in FIG. 6(c), the sliver continues to be in contact with the face of the vacuum source 500. With the removal of each sliver off the vacuum block, this process is repeatedly carried out for each successive sliver most adjacent to the edge. FIG. 6(d) shows how the wafer 400 is progressively moved toward the vacuum source 500 by the thickness of a sliver or related distance so that the vacuum source 500 removes inwardly positioned slivers 452 from the wafer 400.

In another embodiment, the vacuum is ON all the time. When the wafer is moved towards the vacuum block and when on close proximity the closest sliver is pulled down onto the vacuum orifices, a sensor detects this occurrence and reverses the motion of the wafer so snapping off and leaving the sliver engaged on the vacuum block. Once this sliver has been removed, the wafer is moved down towards the vacuum block again to start the next cycle.

As depicted in FIG. 6, the vacuum source 500 pulls of the sliver in the plane of the wafer. However, this need not be the case. The slivers may be pulled off or extracted at other angles relative to the plane of the wafer.

A device or apparatus may be readily practiced using the foregoing method to separate slivers from the wafer of semiconductor material. As described in greater detail hereinafter, a yoke or jig is used to hold the wafer having slivers. Preferably, the yoke is coupled to a lever or arm of a robotic machine that can position a sliver adjacent to the vacuum source 500 and then displace the wafer and the vacuum source 500 relative to each other a predetermined distance to separate the sliver having vacuum applied to the elongated semiconductor strip from the wafer.

Assembling Slivers into an Array Using Belts

Figure 32:
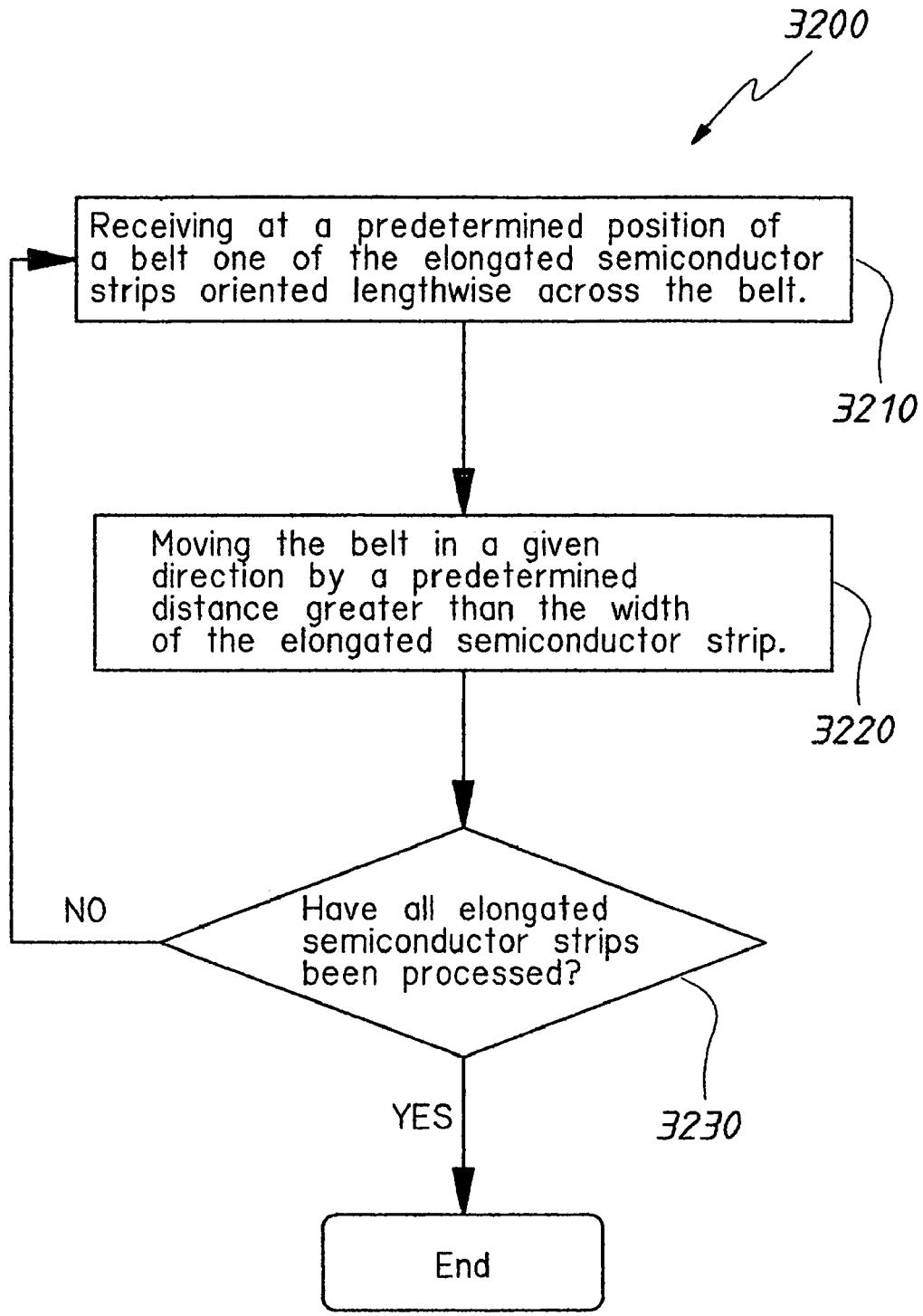
FIG. 32 is a flow diagram illustrating a method of assembling several slivers separated from the wafer into an array of slivers.

Another embodiment of the invention provides a method 3200 of assembling slivers, separated from a wafer of semiconductor material, into an array as shown in FIG. 32. In step 3210, one of the elongated semiconductor strips or slivers is received at predetermined positions of at least one belt oriented lengthwise across the belt. In step 3220, the belt is moved in a given direction by a predetermined distance greater than the width of the elongated semiconductor strip. In decision step 3230, a check is made to determine if all of the elongated semiconductor strips have been processed. If step 3230 returns false (NO), processing continues at step 3210. In this manner, the receiving and moving steps are repeated until all of the elongated semiconductor strips have been processed. If step 3230 returns true (YES), processing terminates. Further details of this process are set forth hereinafter with reference to FIG. 8. For example, the at least one belt may be porous to allow vacuum action through it, or the belt may have openings, perforations, weaving, or the like, to enable use with the vacuum source.

Between the first set of belts and the second set of belts, testing of the sliver takes place and any faulty or broken sliver is rejected. Well-known mechanisms are described hereinafter in the embodiments that may be practiced to carry out these functions.

Figure 8:
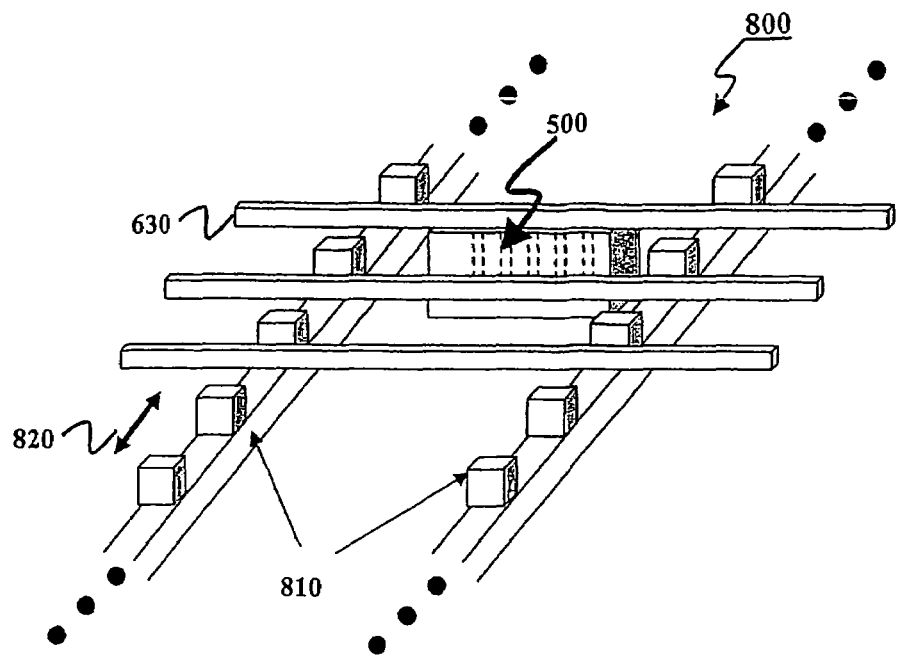
FIG. 8 is a schematic diagram illustrating an arrangement of a vacuum source and a first pair of castellated belts for receiving slivers or strips separated from the wafer by the vacuum source.

A sliver oriented lengthwise is received at preferably a pair of parallel belts at predetermined positions of the parallel belts across the belts as depicted generally in FIG. 8. The drawing shows a configuration 800 of belts 810 and a vacuum source 500. The belts 810 are preferably castellated, having castellations or teeth projecting upwardly. Several slivers 630 are shown each lying between an adjacent pair of castellations on each belt. A predetermined distance 820 separates adjacent castellations. The vacuum source 500 applies a vacuum to a face of the sliver 630 and is used to deliver the sliver at the predetermined position. The belts 810 move synchronously in a given direction by a predetermined distance greater than the width of the sliver. The predetermined distance is preferably relative to the vacuum source 500. In this manner, the slivers 630 as depicted in FIG. 8 are fed forward. Again, the foregoing receiving and moving operations repeat until all of the slivers 630 have been processed.

While the belts 810 are depicted as being castellated timing belts, in an alternative embodiment of the invention, the belts may be made of a tape-like fabric and have adhesive on a surface upon which the slivers 630 are received. Further, the belts may be made of Mylar. This would allow lengths of assembled belts of slivers to be readily manufactured and cut to length or provided in predetermined lengths.

While the vacuum block is shown to engage only one sliver, another implementation may use a wide vacuum block that engages not only the sliver being separated off the wafer, but several slivers in the forward index positions. This serves to maintain hold-down control of the sliver during indexing. Beyond this, roof rails positioned above the slivers are another mechanism to confine the slivers from jumping out of their location on the indexing belts—vacuum hold-down should be continued until the slivers are under the roof rails.

As depicted in FIG. 8, the castellated belts have a distance between adjacent castellations substantially wider than the width of the sliver. This permits a sliver to be placed readily between castellations of each belt without flipping over the sliver 630 and thereby changing its orientation vis-à-vis other slivers.

Apparatuses for Separating and Assembling Slivers

Figure 13A:
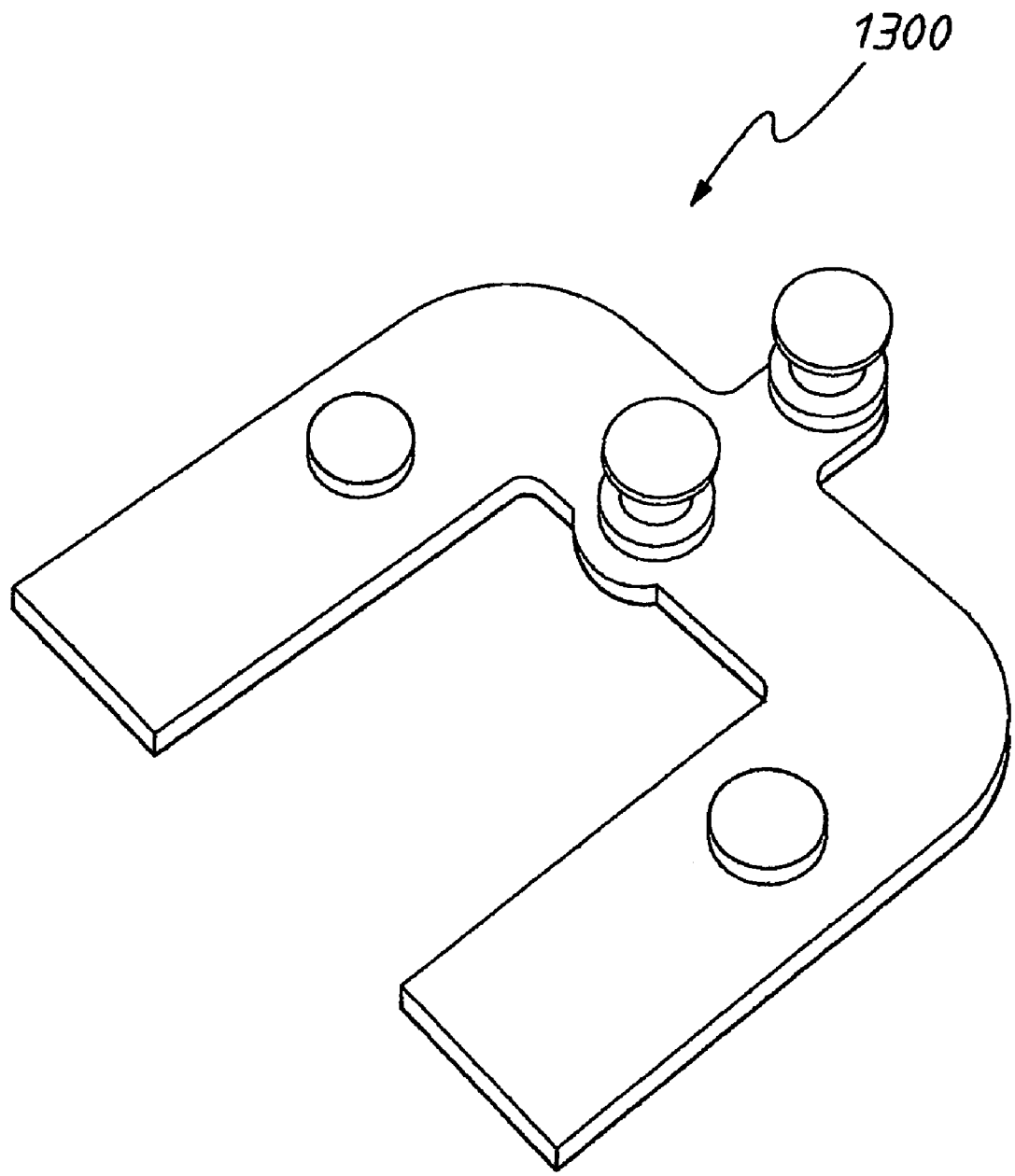
FIGS. 13(*a*) to 13(*c*) are images showing a yoke for holding a wafer having slivers or strips formed in the wafer.
Figure 13B:
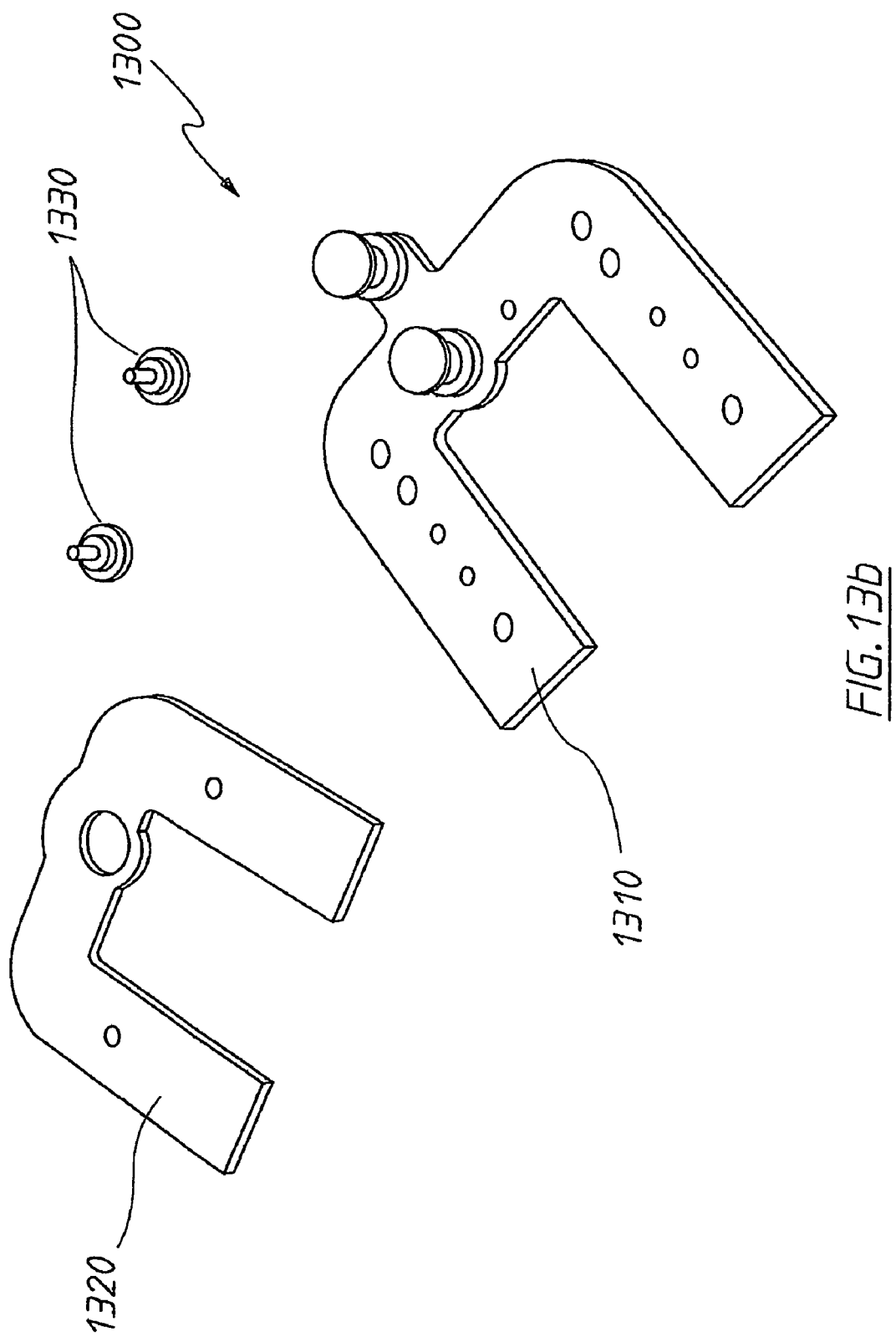
Figure 13C:
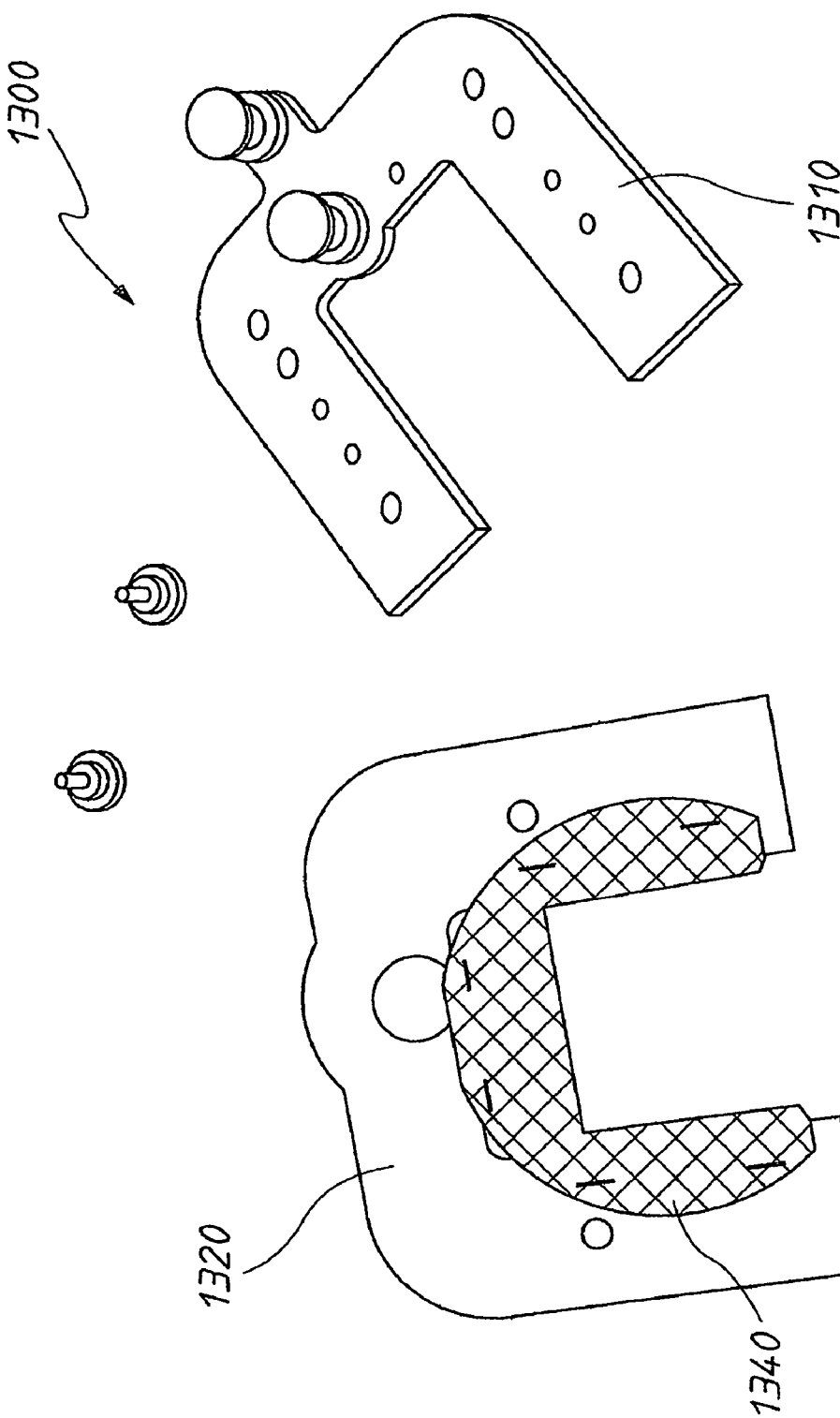

Another embodiment of the invention provides an apparatus for separating elongated semiconductor strips from a wafer of semiconductor material. This apparatus is preferably implemented as a robotic device 1400 shown in FIG. 14. The robotic device 1400 has a mechanism for holding a wafer with slivers formed in a substantially parallel manner with respect to each other in the wafer (not shown). This holding function is implemented using a yoke 1300, or substantially U-shaped clamp, for securing a wafer as shown in FIGS. 13(*a*) to 13(*c*). FIG. 13(*a*) shows an image of the yoke 1300 in assembled form, and FIGS. 13(*b*) and 13(*c*) show the yoke 1300 disassembled. The yoke 1300 comprises two U-shaped yoke plates 1320 and 1330 that can sandwich a wafer 1340 between the plates 1320 and 1330, which are held together by a fastener, say with two screws 1330. The yoke plates 1310 and 1320 having holes with which registration holes in the wafer 1340 (not shown) can be used to align the wafer 1340 with the yoke plates 1310 and 1320.

Figure 14:
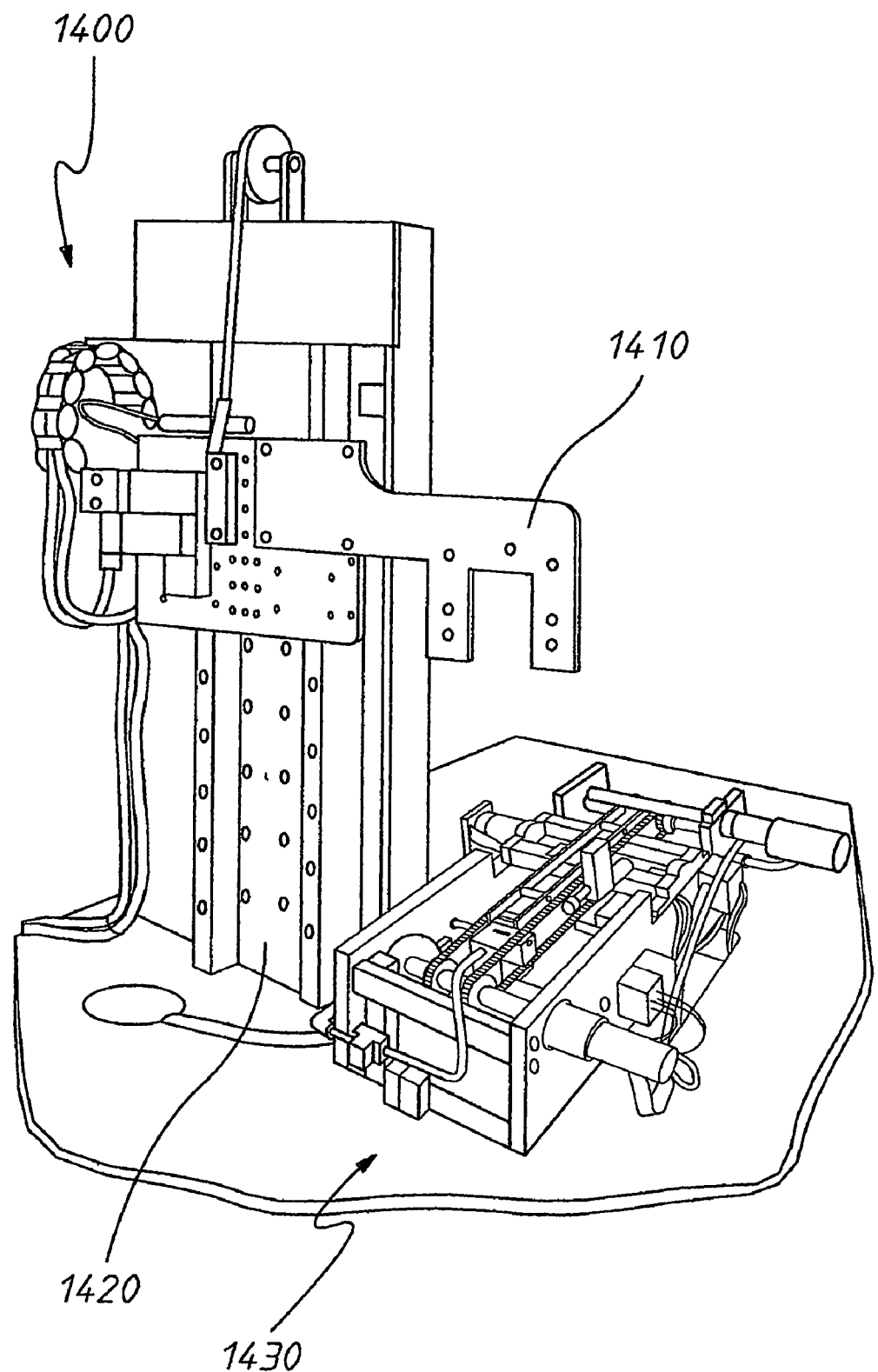
FIG. 14 is an image of a robotic device for separating strips or slivers from a wafer of semiconductor material.
Figure 15:
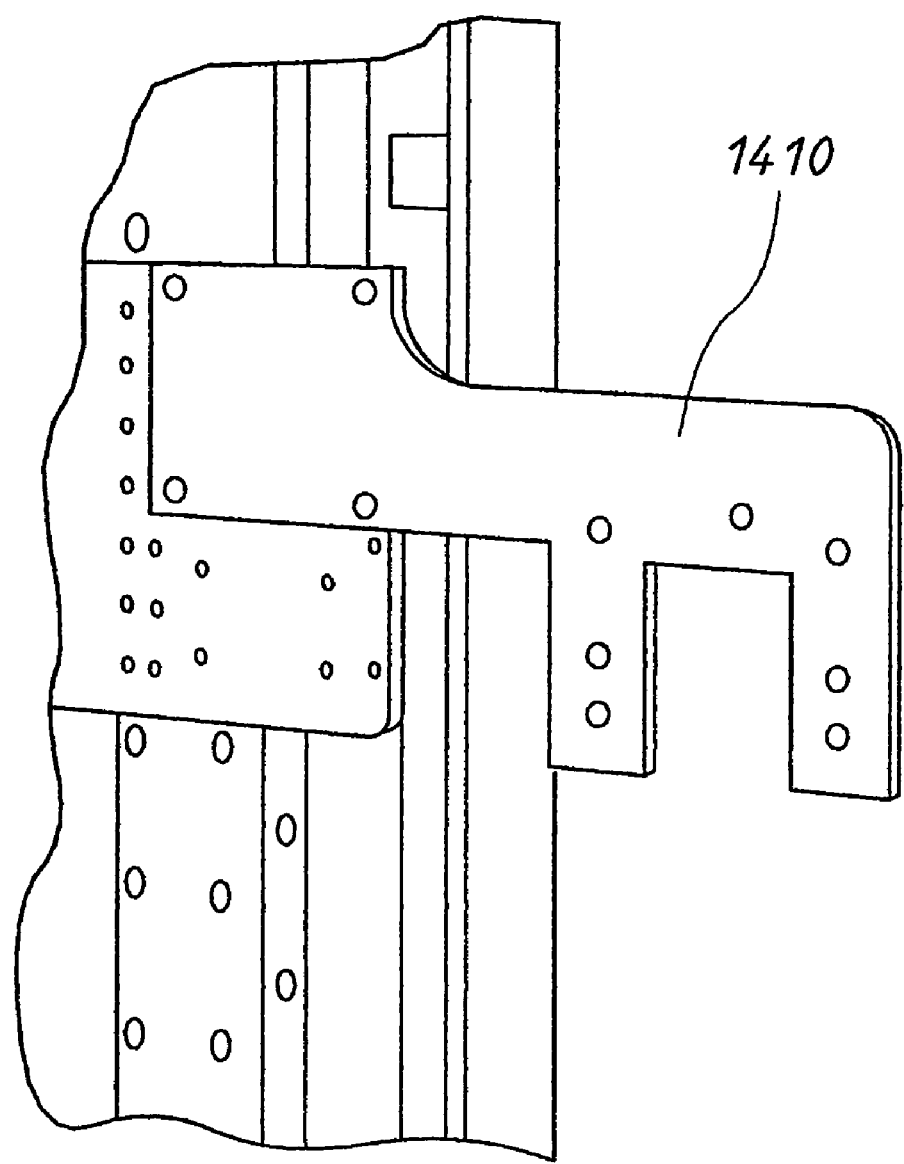
FIG. 15 is an image of an arm of the robotic device of FIG. 14 for holding a yoke that holds a wafer.
Figure 16:
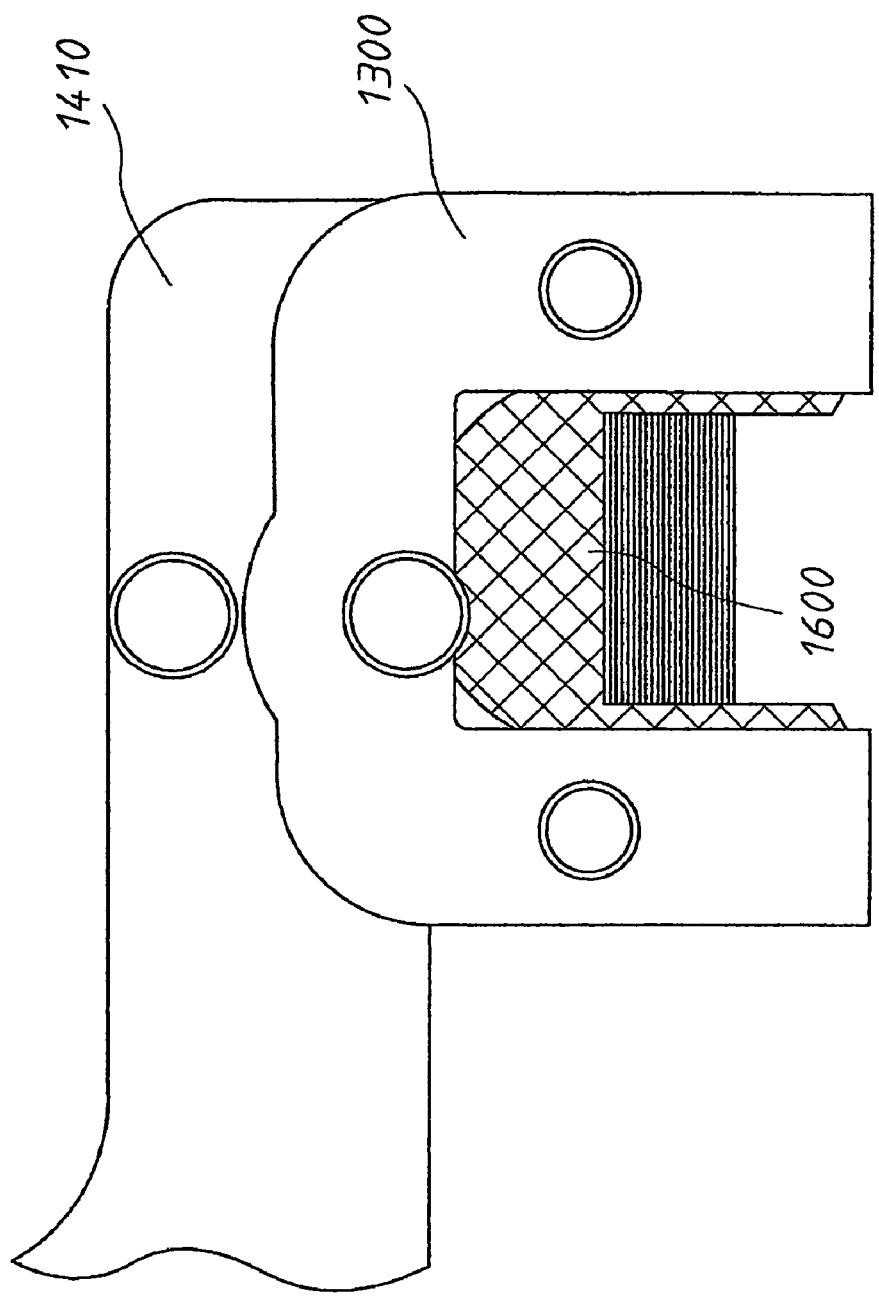
FIG. 16 is an image of a yoke connected to the arm of FIG. 15.

An arm 1410 of the robotic device 1400 is shown generally in FIG. 14 and in greater detail in FIG. 15. The arm 1410 has depending elongated members spaced apart at one end forming a complementary shape to that of the yoke 1300 and has registration pins with which the yoke 1300 can be aligned. The yoke 1300 preferably connects to the arm 1410 magnetically. FIG. 16 is an image showing the yoke 1300 holding a semiconductor wafer 1600 connected to the arm or lever 1410. The holding function further has an elevator mechanism 1420 shown in FIG. 14 that can raise and lower the arm 1410 and hence the wafer 1600 relative to a vacuum source (not shown) in the assembly 1430 of FIG. 14. Thus the robotic device 1400 displaces the wafer 1600 and the vacuum source by moving the arm 1410 preferably. This implements the functionality of moving the wafer so that the face of a sliver is in close proximity to the vacuum source 1710. Alternatively, this functionality may be achieved by moving a vacuum source relative to a wafer that is held fixedly in place, so that the vacuum source is in close proximity to the face of the sliver. It will be apparent to those skilled in the art that the displacement of the wafer relative to the vacuum source can be achieved in other ways without departing from the scope and spirit of the invention. The displacement is a predetermined distance to separate the sliver from the wafer and can be programmably adjusted as slivers are removed from the wafer so that the slivers are progressively removed inwardly across the wafer.

Alternative embodiments of the above wafer clamp can be designed to mount more than one wafer, so that multiple slivers can be separated at the same time.

Figure 17:
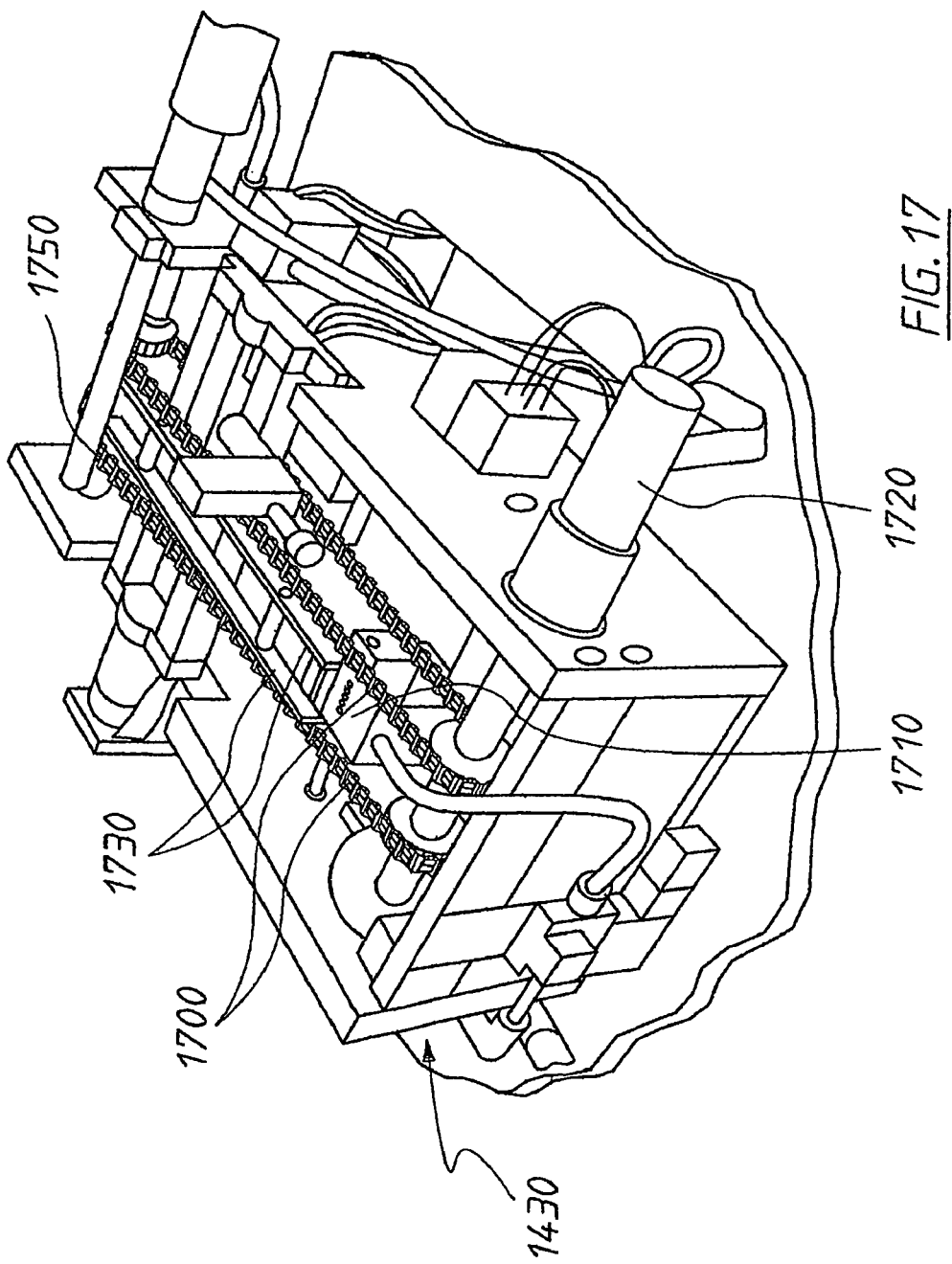
FIGS. 17, 18, and 19 are more detailed images of an assembly in the robotic device of FIG. 14 including a vacuum source or block disposed between a first pair of belts and a mechanism for testing slivers or strips and removing defective slivers or strips from the belts.
Figure 18:
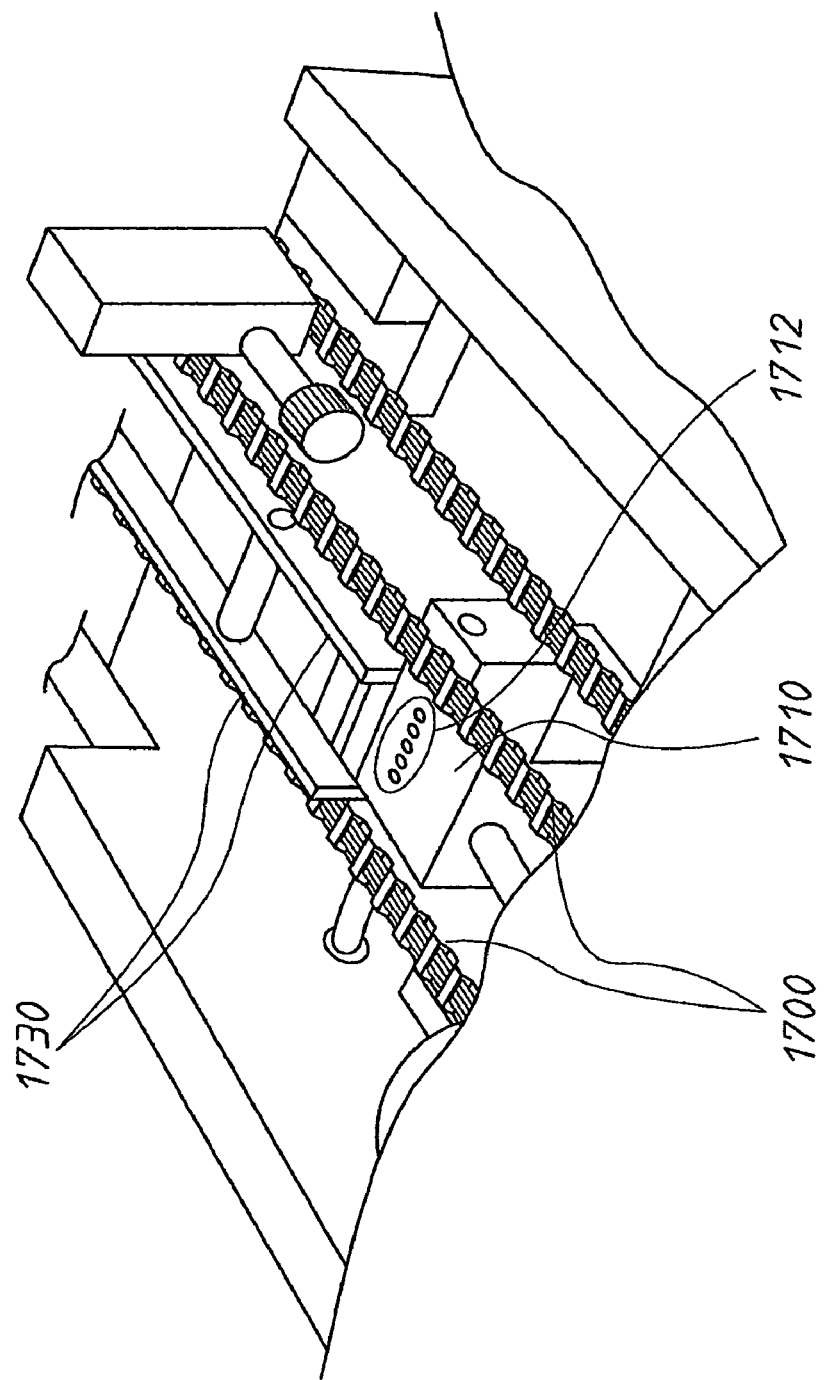
Figure 19:
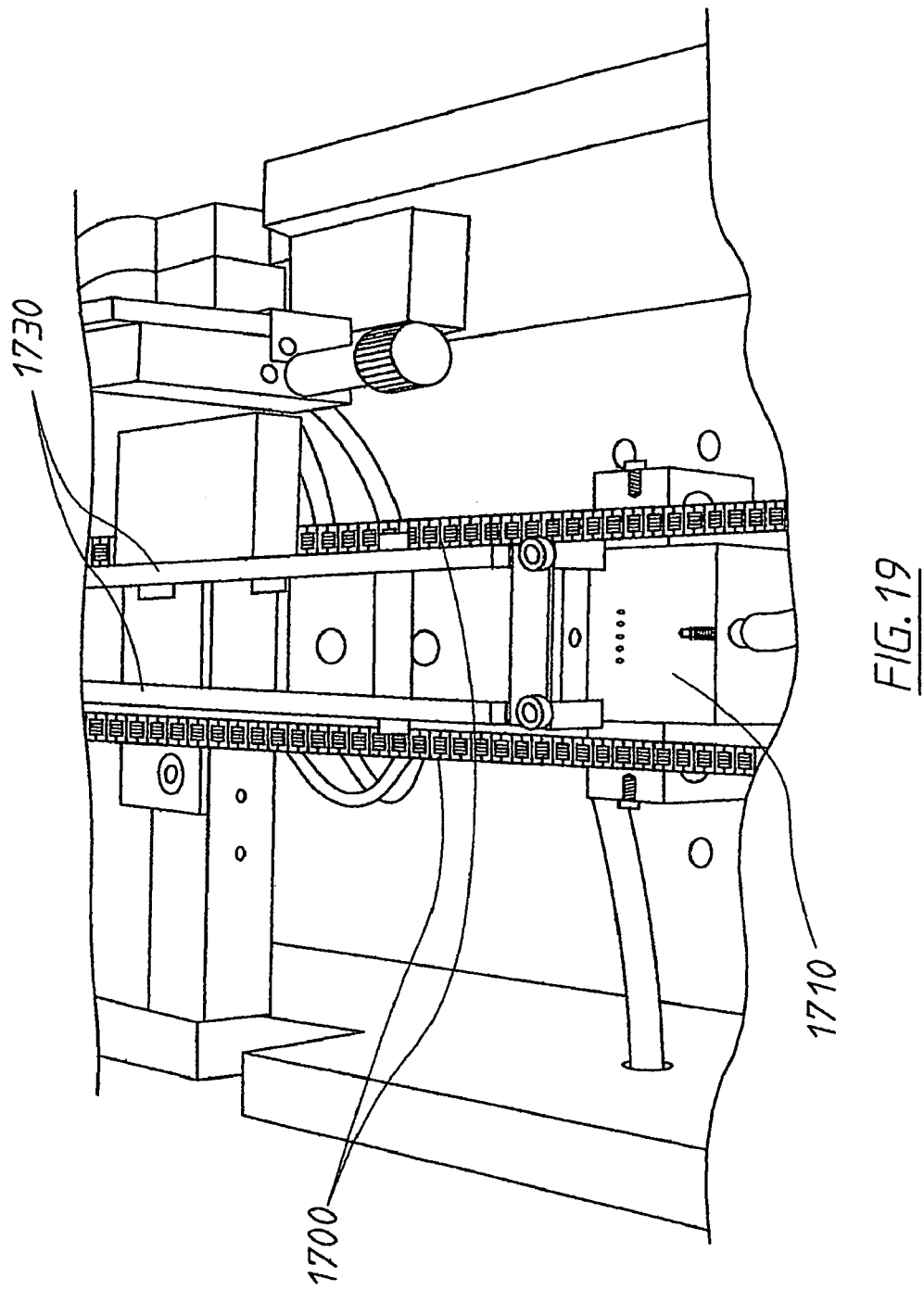
Figure 27:
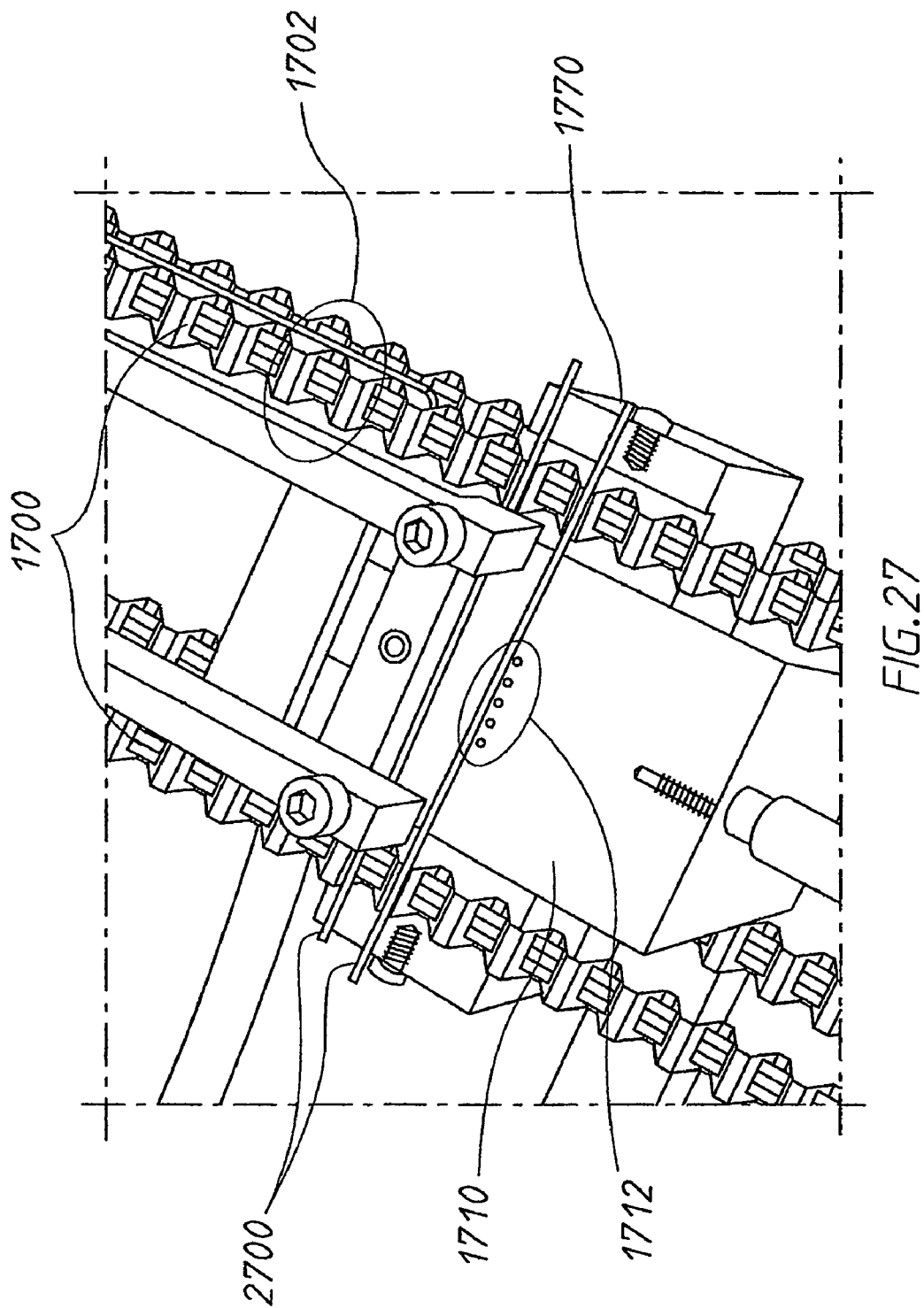
FIG. 27 is a more detailed image of the vacuum block and belts of FIGS. 17 to 19.

FIGS. 17, 18, 19 and 27 are images showing a vacuum source 1710 (or vacuum block) in the assembly 1430 of FIG. 14. The vacuum source 1710 applies vacuum to the face of a sliver (such as the lower sliver 2700 in FIG. 27 shown directly above channel orifices 1712 in FIG. 27. The body of the vacuum source 1710 is preferably made of metal but other materials may be used without departing from the scope and spirit of the invention. The vacuum source 1710 has a body with at least one cavity formed in the body for providing the applied vacuum. The cavity or cavities are arranged in a surface of the body that can be placed adjacent the face of the sliver. The orifices are substantially the same in size as or smaller than a dimension of the face. While five circular orifices 1712 are depicted in FIGS. 18 and 27, it will be appreciated by those skilled in the art that different numbers and shapes of orifices may be practiced without departing from the scope and spirit of the invention. The vacuum applied to the sliver may be reduced or terminated to release the sliver from the vacuum source 1710 following separation from the wafer, as described hereinafter. However, in the embodiment shown, the vacuum source may operate continuously at essentially the same level of vacuum.

The assembly 1430 has a pair of castellated belts 1700, each belt positioned on an opposite end of the vacuum source 1710, which is located between the belts 1700 so that the space between a pair of castellations in each belt are aligned with the orifices configured lengthwise in the top surface of the vacuum source 1710. The belts 1700 are flexible and may be made of materials such as rubber, plastic, elastomer and any other suitable material. A motor 1720 is used to turn the belts 1700 in step (i.e., in a programmed or regular manner) in cooperation with the operation of the arm 1410 and the vacuum source 1710. Movement of the belts 1700 displaces the separated sliver from the vacuum source 1710 relative to each other. A drum 1760 is provided at the opposite end of the belts relative to the motor 1720 for moving the belt. As described in greater detail hereinafter, the drum 1760 preferably has a vacuum source also.

A programmable logic controller (PLC) may be used to control and synchronise operation of the arm 1410 and elevating mechanism 1420, the vacuum source 1710, and the belts 1700 to repeatedly perform operations to separate one or more of the slivers from the wafer. A PLC is not shown in the drawings, but will be well understood by those skilled in the art. Numerous other processors and controllers may be practiced to implement these control and synchronization functions.

FIGS. 17 to 21 and 27 also show a pair of rails 1730 above and parallel to the pair of belts 1700, which are positioned to prevent slivers from flipping over or lifting out of the spaces between pairs of castellations in the belts 1700. The rails are rectangular in form and are made out of metal in this embodiment, although again other structures and materials may be utilized to achieve this functionality.

Figure 20:
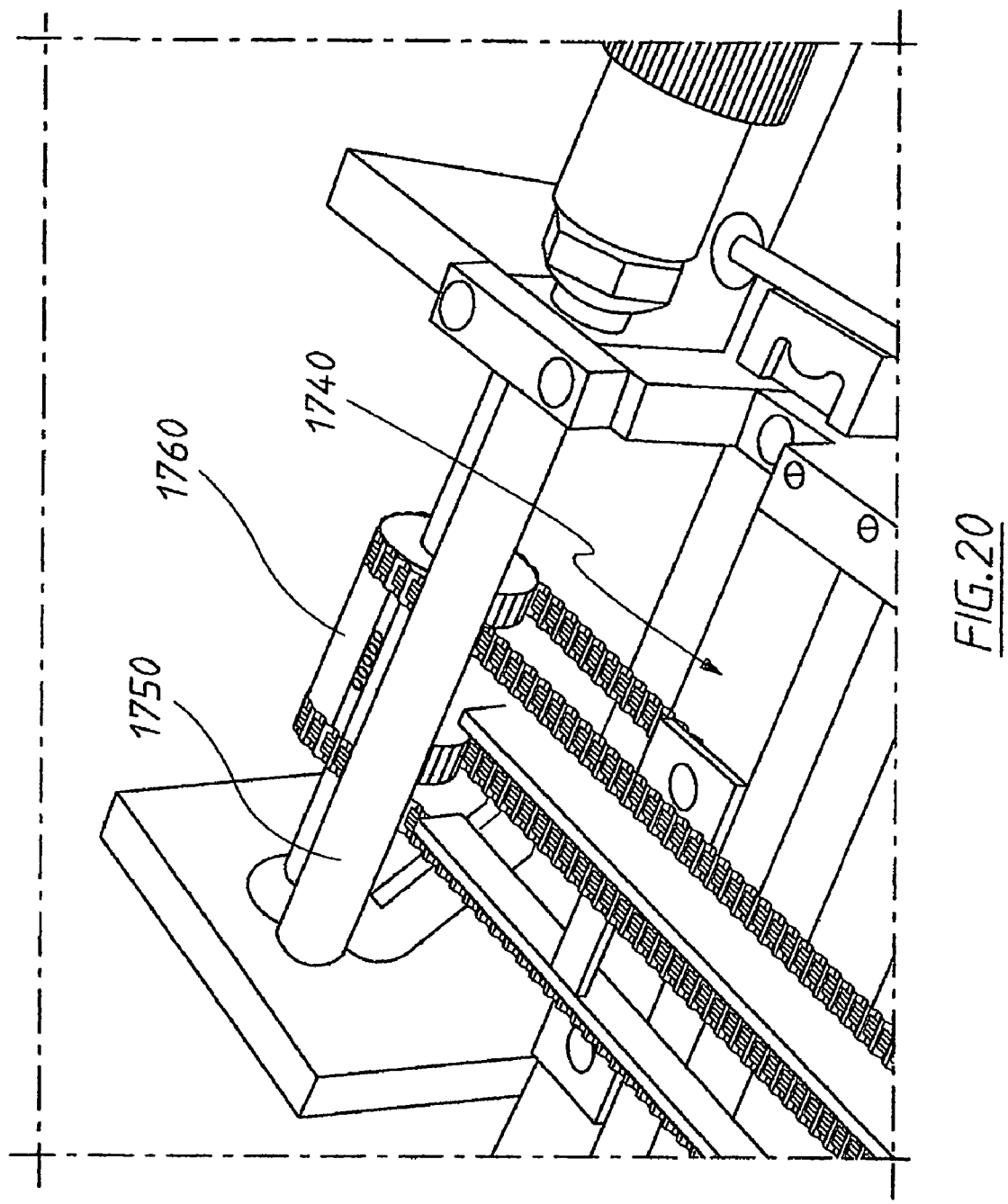
FIG. 20 is a more detailed image of the mechanism of FIG. 17 for removing defective slivers or strips from the belts.

The assembly 1430 also can be arranged with a testing device to test the electrical properties of the slivers while located on the belt as each sliver passes over or is adjacent to the testing mechanism. The testing device is not shown in the Figures but may be positioned in the assembly 1730 at the position denoted generally by arrow 1740 in the image of FIG. 20. For example, the sliver may be tested by applying light from a light source to the sliver (e.g. 1 sun) and measuring the resulting voltage produced by the sliver. The results of such testing can be reported to the controller, or other suitable mechanism, for removing defective slivers from the belt and maintaining information about the empty position in the belts 1700 that results. As indicated in FIGS. 17 and 20, a vacuum source 1750 is positioned in the assembly 1730 to remove defective slivers, after testing and in response to the testing results. Preferably, the vacuum source 1750 for removing defective slivers is positioned above the belts 1700, after the testing mechanism location but before the drum 1760. The removal of such a defective sliver from the belts is tracked for the purposes of further processing using the belts.

Projections 1770 of FIG. 27 are located on opposite sides outside of the belts 1700. In the Figure, the projections are implemented by adjustable screws. These projections are used to remove dags from the internal edges of the wafer frames after slivers have snapped off. Other techniques and devices may be practiced for this purpose without departing from the scope and spirit of the invention.

Such a technique may involve the creation of a secondary but stronger set of weak points outside of the first set of weak points, so that the projection means are used to remove a larger piece of the wafer that includes the abovementioned dags.

FIG. 39 illustrates a sliver tester 3900 in accordance with another embodiment of the invention. Slivers 3930 are located between castellations 3940 and a skid keeps the slivers from flipping or rotating. There may a gap of 0.5 mm between the skid and the belt 3940 where the slivers are 1.0 mm wide. A light source 3910 illuminates a sliver 3930B, where a "soft clasp" tester is moved up to contact opposite side edges of the sliver 3930B using a servo motor and cam. The cam has opposite flat surfaces so that the spaced apart electrodes are brought into contact with the sliver 3930B, when the cam turns. The tester measures the voltage produced in the sliver 3930B. Following which the cam is turned again to remove the electrodes from clasping the sliver and then the electrodes are retracted.

Sliver testing may be performed by direct or indirect that may or may not require illumination, or even physical contact with the sliver. Alternative methods to achieve the functionality of sliver testing are well known to those skilled in the art.

Refining Spacing Between Slivers Using a Second Pair of Belts

Figure 33:
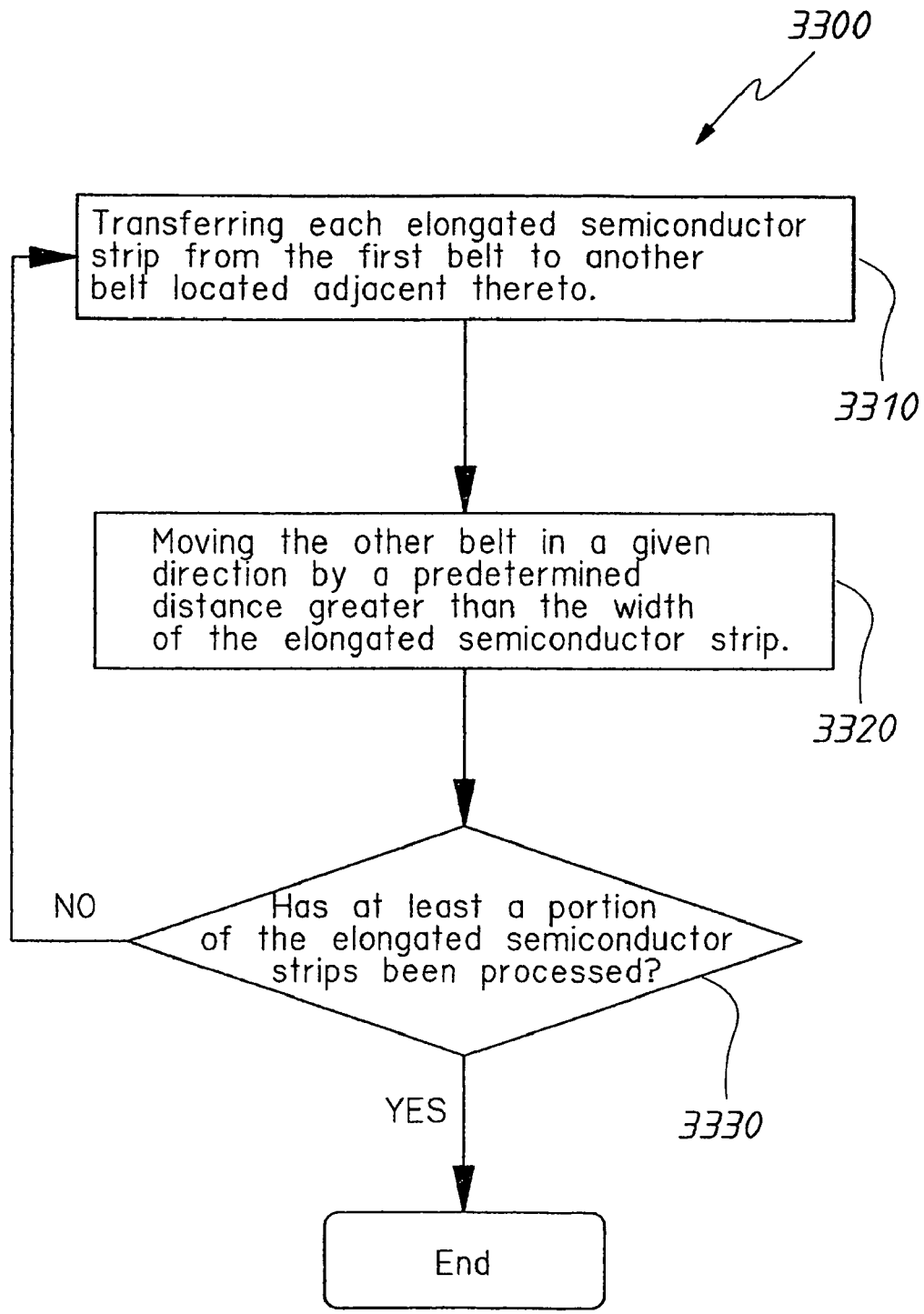
FIG. 33 is flow diagram illustrating a method of refining the spacing between slivers using a second pair of belts.

FIG. 33 is flow diagram illustrating a method 3300 of refining the spacing between slivers using a second pair of belts. In step 3310, each elongated semiconductor strip is transferred from the at least one belt to at least one other belt located adjacent thereto. The transferring step preferably involves applying vacuum to each elongated semiconductor strip during movement of the other belt. The other belt has castellations with a distance between adjacent castellations greater than the width of an elongated semiconductor strip but substantially less than adjacent castellations of the at least one belt that received the elongated semiconductor strip. In step 3230, the at least one other belt moves in a given direction by a predetermined distance. This distance is greater than the width of the elongated semiconductor strip. In decision step 3330, a check is made to determine if at least a portion, or all, of the elongated semiconductor strips have been processed forming the array of strips. If step 3330 returns false (NO), processing continues at step 3310. In this manner, the transferring and moving steps are repeated until the portion of strips has been processed. Otherwise, if step 3330 returns true (YES), processing terminates. Further details of this processing are described hereinafter with reference to FIG. 9.

Figure 9:
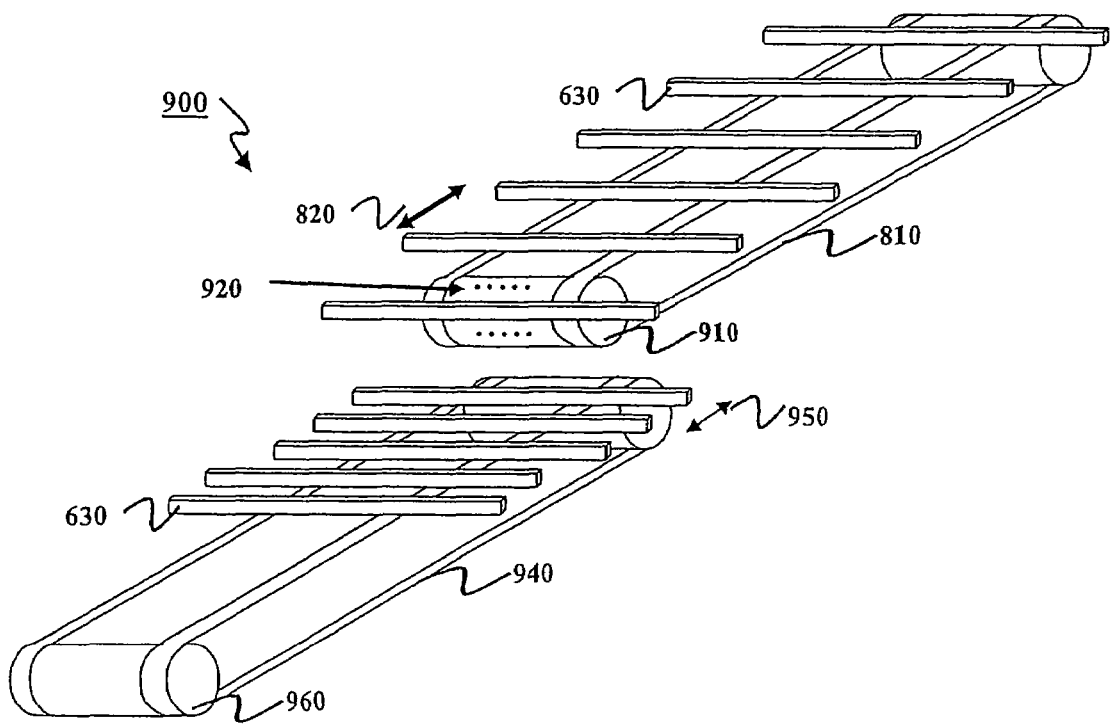
FIG. 9 is a schematic diagram illustrating the first pair of belts of FIG. 8, a drum adapted to applying vacuum to slivers or strips, and a second pair of belts.

The spacing between slivers may be reduced using the mechanism 900 of FIG. 9. In particular, FIG. 9 illustrates the first pair of belts 810 of FIG. 8, a drum 10 adapted to apply vacuum via one or more orifices 920 to slivers, and a second pair of belts 940. While castellations are not shown in FIG. 9 to simplify the drawing, it will be readily appreciated visually from the drawing that the spacing 950 of slivers on the second pair of belts 940 is significantly smaller than the distance 820 of the first pair of belts in FIGS. 8 and 9. The drum or roller 910 has orifices in alignment with the space between castellations in the belts 810 and is used to apply vacuum to a face of a sliver so that the sliver can be delivered by rotation about the drum 910 in the smaller spaced 950 castellations (not shown) of the second pair of belts 940. Each sliver is transferred from the first pair of belts 810 to the second pair of belts 940 located adjacent thereto. The distance 950 is greater than the width of a sliver but substantially less than the distance 820. The second pair of belts 940 moves in a given direction by a predetermined distance greater than the width of the sliver. The foregoing steps are repeated until at least a portion of the strips has been processed, thereby forming the array of strips.

The use of two pairs of belts in the foregoing manner is advantageous in that a first pair of belts with widely spaced castellations is used to receive the slivers from the wafer. The slivers can then be tested, and defective slivers removed before the remaining slivers are delivered to the more closely spaced castellations of the second belts in a controlled manner. Attempting to deliver slivers directly from the wafer to the second pair of belts with closely spaced castellations could disadvantageously result in a number of slivers flipping so that not all of the slivers are facing in the same direction once removed from the wafer. Where the slivers are used in devices such as sliver solar cells, this could result in voltages being produced with opposite polarities in series, for example. This would result in reduced efficiencies of the solar modules or arrays.

Gaps in the first belts due to removed/missing slivers are tracked and taken into account to ensure that the second belts are properly populated without unintended gaps in the resulting array.

Optionally, every second gap between castellations in the first belt may be left empty, provided the empty portions of the belt are tracked.

Apparatus for Refining Spacing Between Slivers

Figure 21:
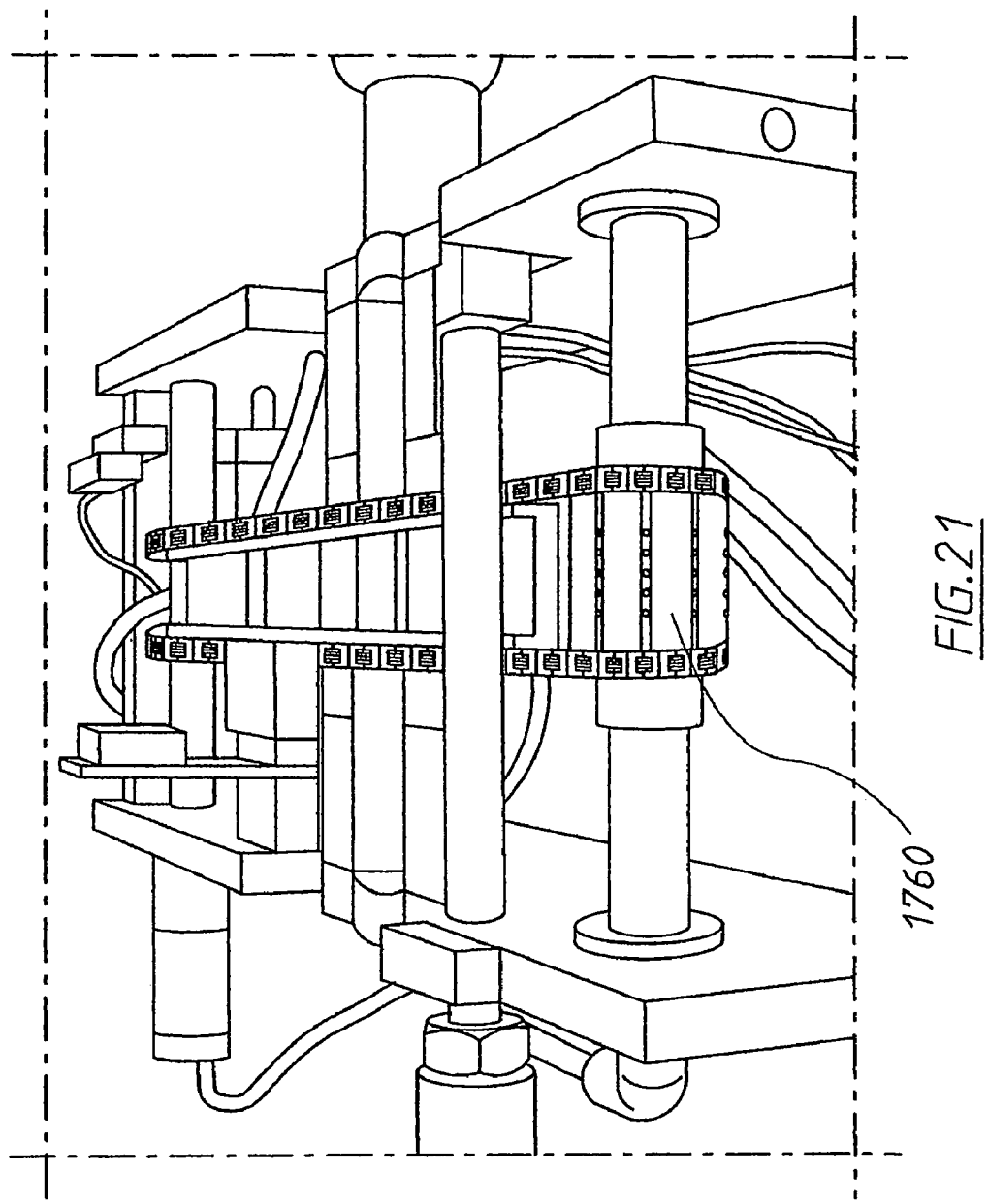
FIGS. 21 and 22 are images of a drum in the belt assembly adapted to apply vacuum to slivers arranged in the belts.
Figure 22:
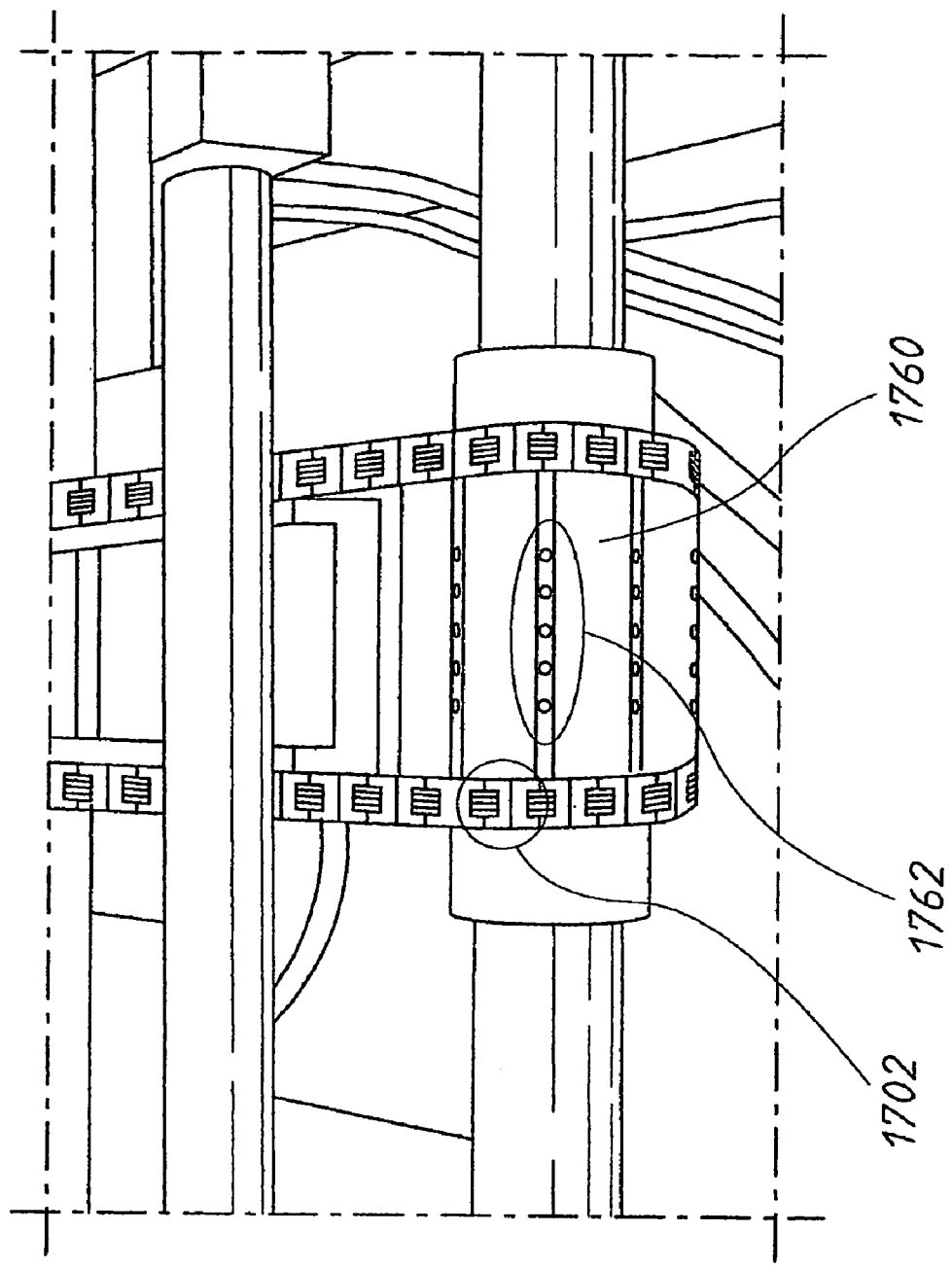

FIGS. 20, 21 and 22 illustrate part of the assembly 1430 that implements the upper belt assembly in FIG. 9. This is part of the apparatus for assembling slivers separated from a wafer of semiconductor material into an array of slivers. The two parallel belts 1700 receive at predetermined positions one of slivers oriented lengthwise across the belts 1700. The motor 1720 of FIG. 17 moves the belts 1700 in a given direction by a predetermined distance greater than the width of the sliver. A controller (not shown) coupled to the motor repeats the receiving and moving operations until all of the slivers have been processed. The apparatus also has at least two further belts (not shown in FIGS. 20, 21, and 22, but depicted schematically in FIG. 9) located adjacent to and below the two belts 1700.

The drum 1760 in combination with the belts 1700 implements the functionality of transferring sliver from the two belts 1700 to the two further belts. The drum 1760 has an arrangement of vacuum channel orifices 1762 aligned with the spacing between adjacent castellations 1702 in each belt 1700 as the belts 1700 rotate about the drum 1760. The two further belts each have castellations with a distance between adjacent castellations greater than the width of a sliver but substantially less than adjacent castellations of the two belts that received the sliver. The drum 1760 comprises a second vacuum source applying vacuum to each strip during movement of the two further belts and ceasing the vacuum to effect transfer of each sliver. A motor moves the two further belts in a given direction by a predetermined distance greater than the width of the elongated semiconductor strip. Again, the controller repeats the transferring and moving operations until at least a portion of the elongated semiconductor strips have been processed forming the array of strips.

An embodiment of the invention uses a reciprocating vacuum block to engage and remove the sliver from its upper belts positions and deposit the sliver to the lower belts' position. This allows the sliver to be under positive engagement continuously, as opposed to being dropped between the upper and lower belts.

Figure 10:
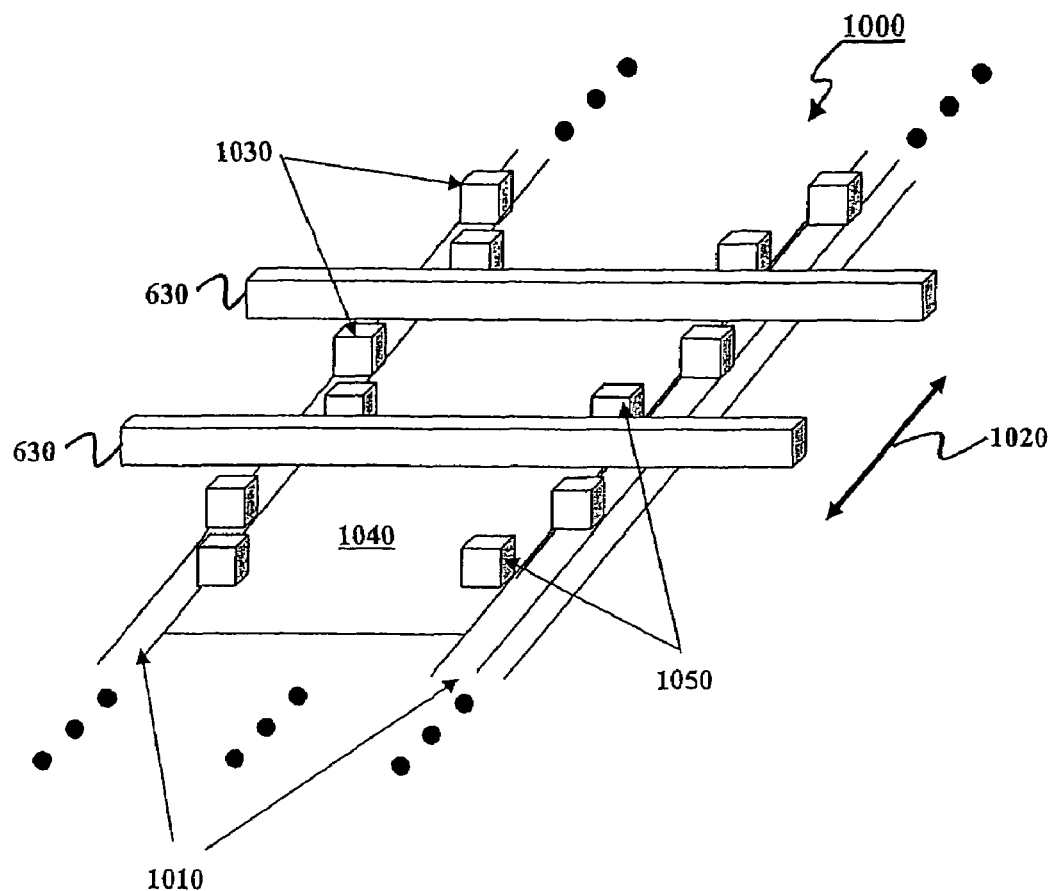
FIG. 10 is a schematic diagram illustrating a reference for adjusting the alignment of slivers arranged in the second pair of belts of FIG. 9.

FIG. 10 is a schematic diagram of a lifter/referencer 1000 for adjusting the spacing of the slivers. In particular, the lifter/reference 1000 removes deviations from the required spacing/location of individual slivers in the array. Thus, the lifter/referencer 1000 changes the spacing of slivers relative to each other. In the lifter/referencer 1000, an outer set of castellations 1030 on each side of the lifter/referencer are displaced with respect to an inner set of castellations 1050 on a slide member 1040. The lifter/referencer 1000 closely spaces together slivers 630 by a predetermined distance 1020 less than the spacing between adjacent castellations in the second pair of belts 940. Preferably, the lifter/referencer 1000 is positioned between the belts 940 to make fine spacing adjustments.

Figure 23:
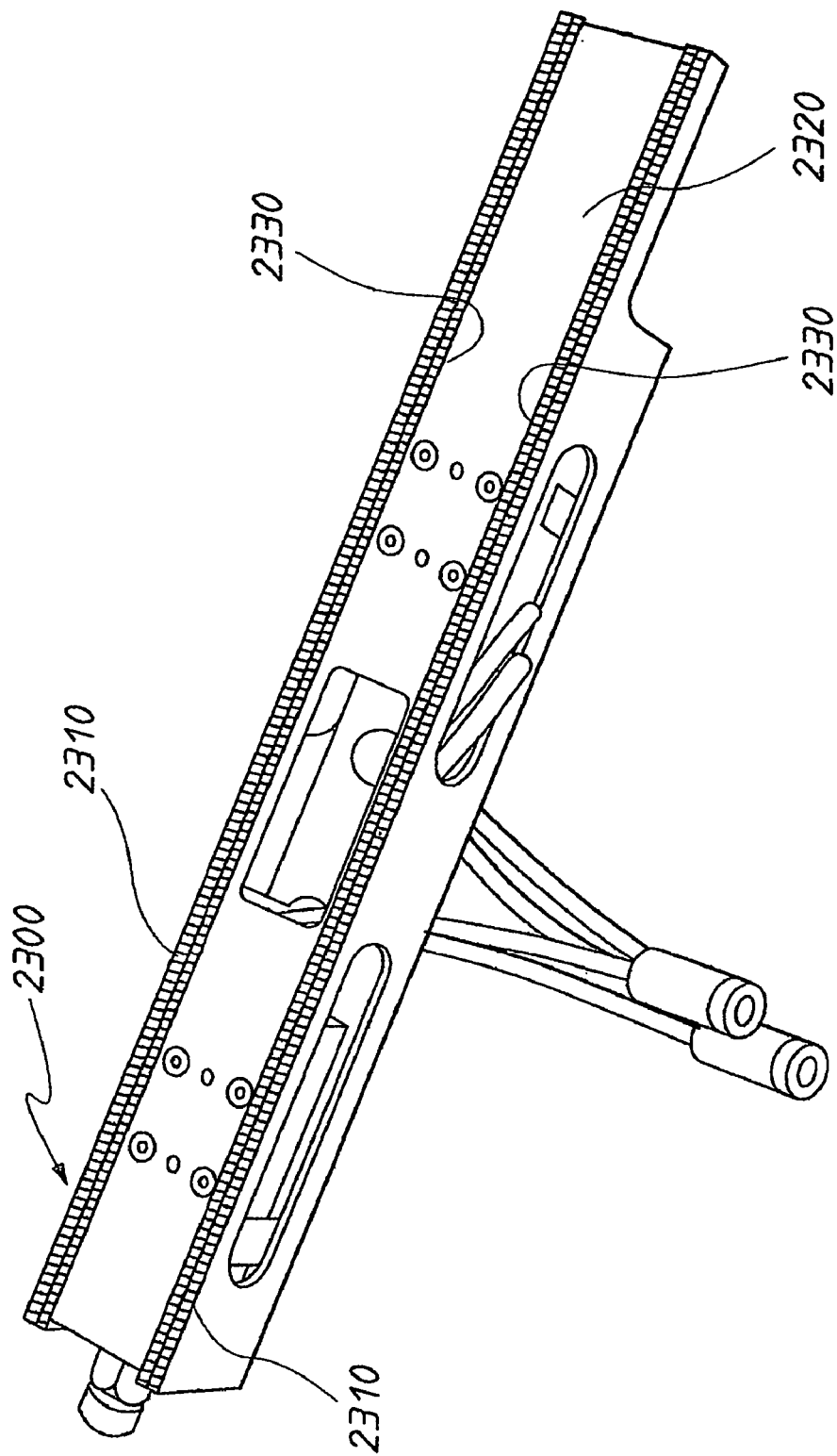
FIGS. 23 and 24 are images of a lifter/referencer for adjusting the alignment and spacing of slivers or strips.
Figure 24:
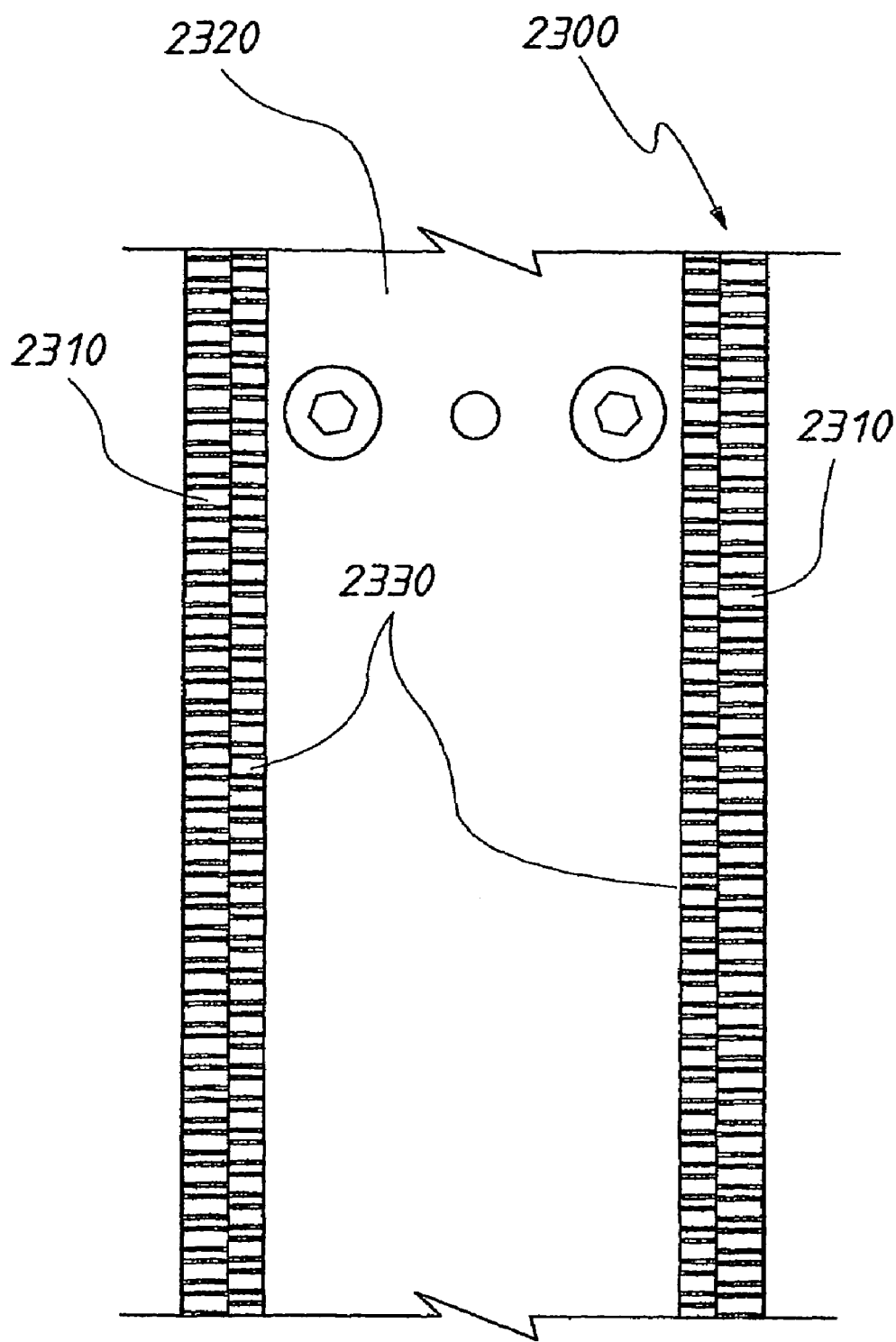

FIGS. 23 and 24 are images of a lifter/referencer 2300 utilising the principles of the lifter/referencer 1000 of FIG. 10. As can be clearly seen in FIG. 24, the outer castellations 2310 on opposite outer sides of the lifter/referencer 2300 are separated by a small distance close to the width of the slivers and an inner set of castellations 2330 is slightly displaced relative to the outer castellations 2310. The inner castellations are connected to a slide member 2320. The inner and outer castellations 2310, 2330 can be displaced relative to each other to fine-tune the position of slivers in the array.

Assembling an Array of Slivers on a Substrate

Figure 34:
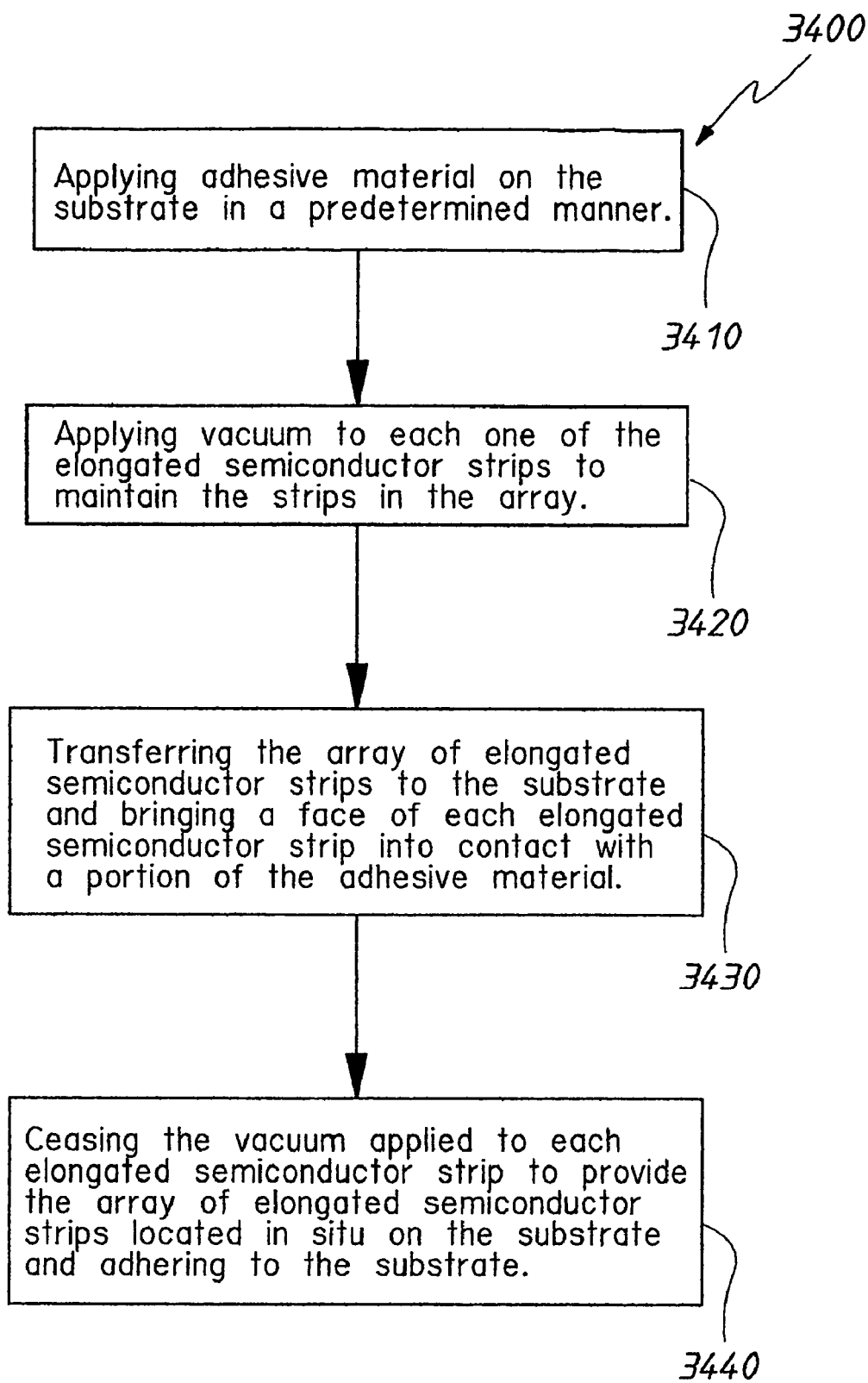
FIG. 34 is a flow diagram illustrating a method of assembling an array of slivers on a substrate.

FIG. 34 illustrates a method 3400 of assembling an array of elongated semiconductor strips on a substrate. In step 3410, adhesive material is applied on the substrate in a predetermined manner. In step 3420, vacuum is applied to each one of the elongated semiconductor strips to maintain the strips in the array. The array is a predefined arrangement of the strips. In step 3430, the array of elongated semiconductor strips is transferred to the substrate, and a face of each elongated semiconductor strip is brought into contact with a portion of the adhesive material. In step 3440, the vacuum applied to each elongated semiconductor strip ceases to provide the array of elongated semiconductor strips located in situ on the substrate and adhering to the substrate.

Figure 28:
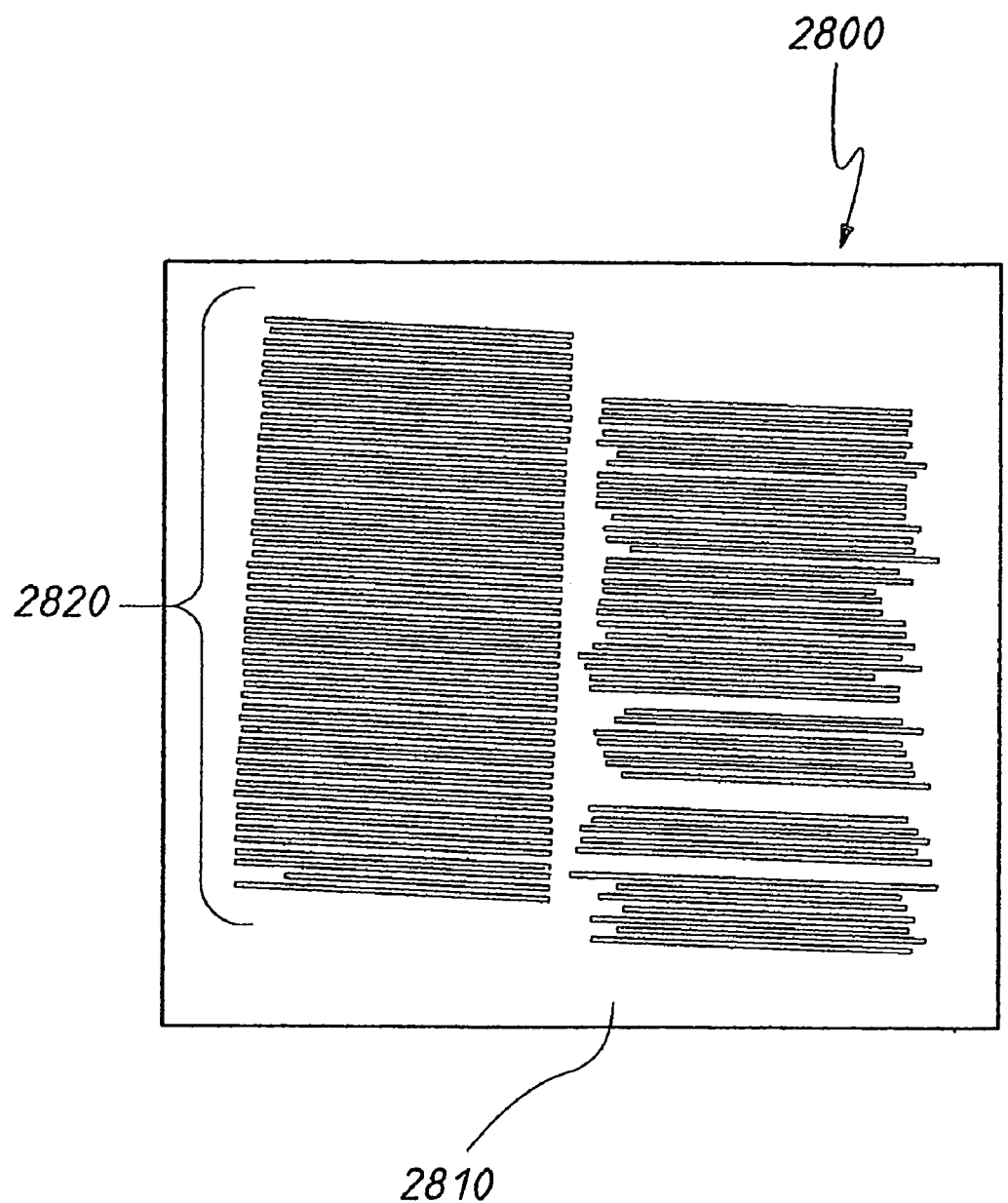
FIG. 28 is an image of an array of slivers or strips assembled on a substrate.

FIG. 28 is an image showing the configuration of an array 2820 of slivers assembled on a substrate 2810 using this method 3400.

Figure 25:
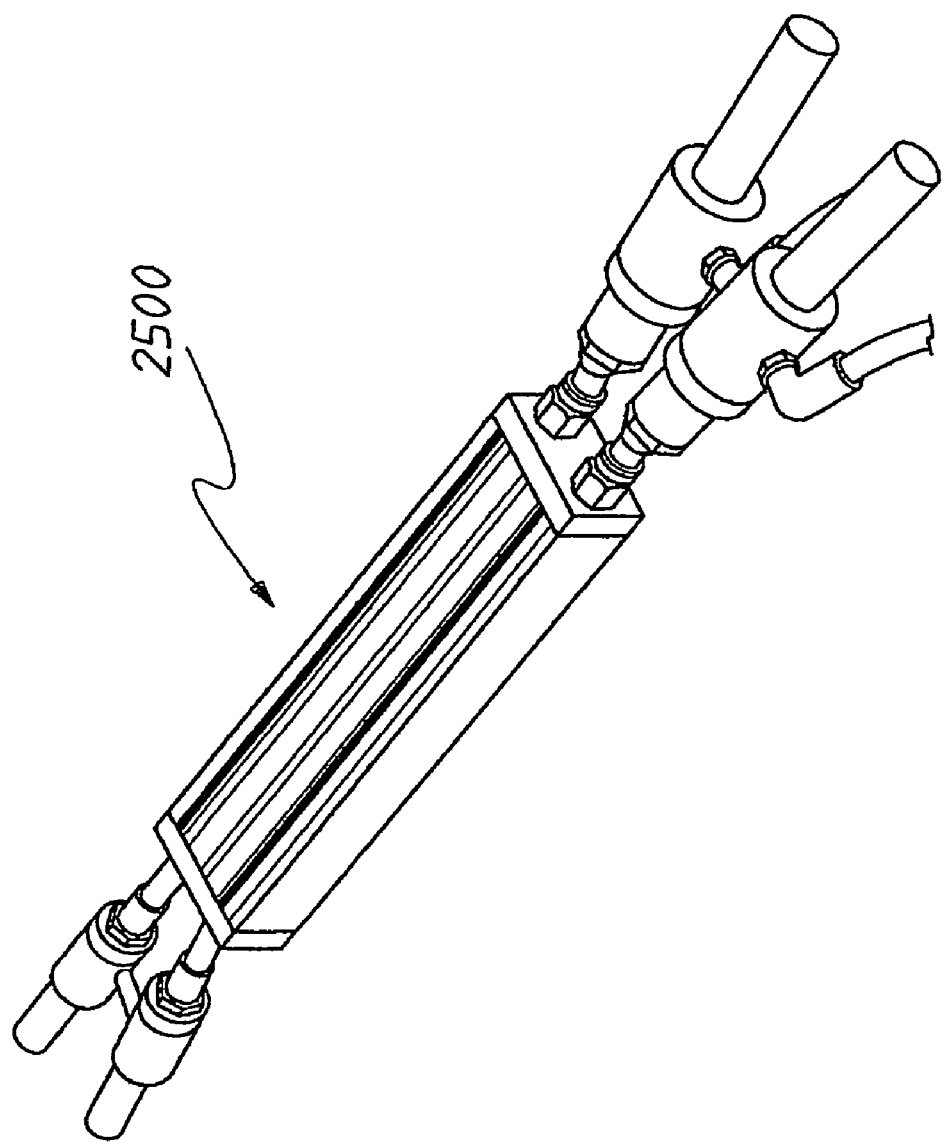
FIGS. 25 and 26 are images of transfer mechanism adapted to apply vacuum to slivers or strips in an array of slivers from spacing belts and/or lifter/reference and to transfer the array to a substrate.
Figure 26:
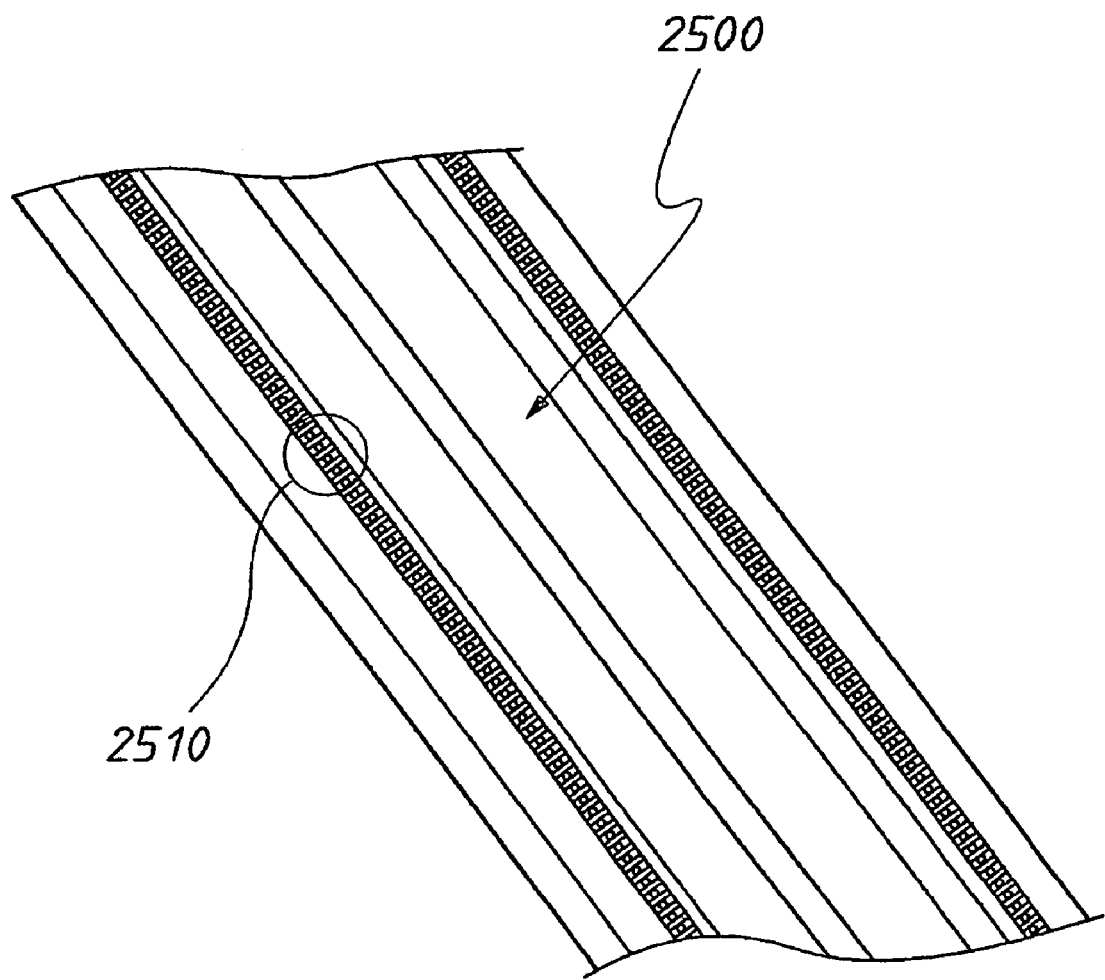

FIGS. 25 and 26 are images of a transfer mechanism 2500 adapted to apply vacuum to slivers or strips in an array of slivers in spacing belts and/or lifter/referencer and to transfer the array to a substrate. The transfer mechanism 2500 is shown upside down to illustrate castellations and vacuum channel orifices 2510. The castellations of the transfer mechanism 2500 are spaced to align with the lifter/referencer. Vacuum can be applied to the array of slivers to lift them from the lifter/referencer and then move them using the transfer mechanism, which is preferably implemented with a robotic arm to transfer the array of slivers to the substrate. The robotic arm may implement rotary motion and/or use variable orientation for placement of the array on a substrate. Numerous variations are possible without departing from the scope and spirit of the invention.

Figure 29:
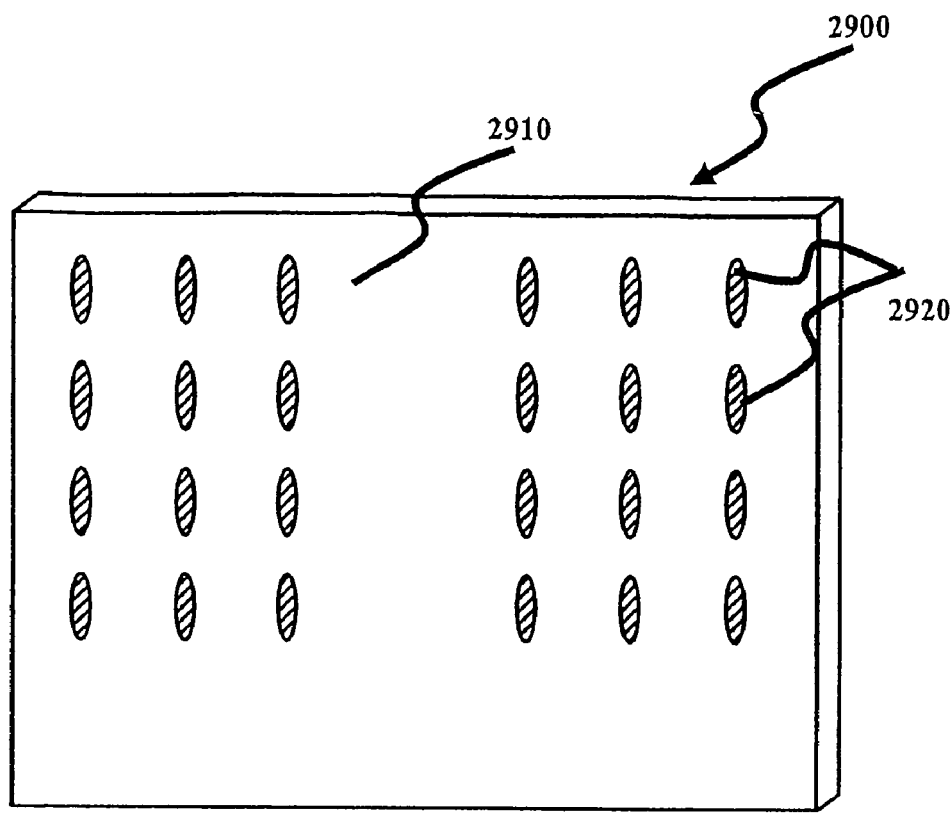
FIGS. 29 to 31 are schematic diagrams illustrating the process of assembling an array of slivers on a substrate, including depositing electrically conductive material and adhesive material on the substrate.
Figure 30:
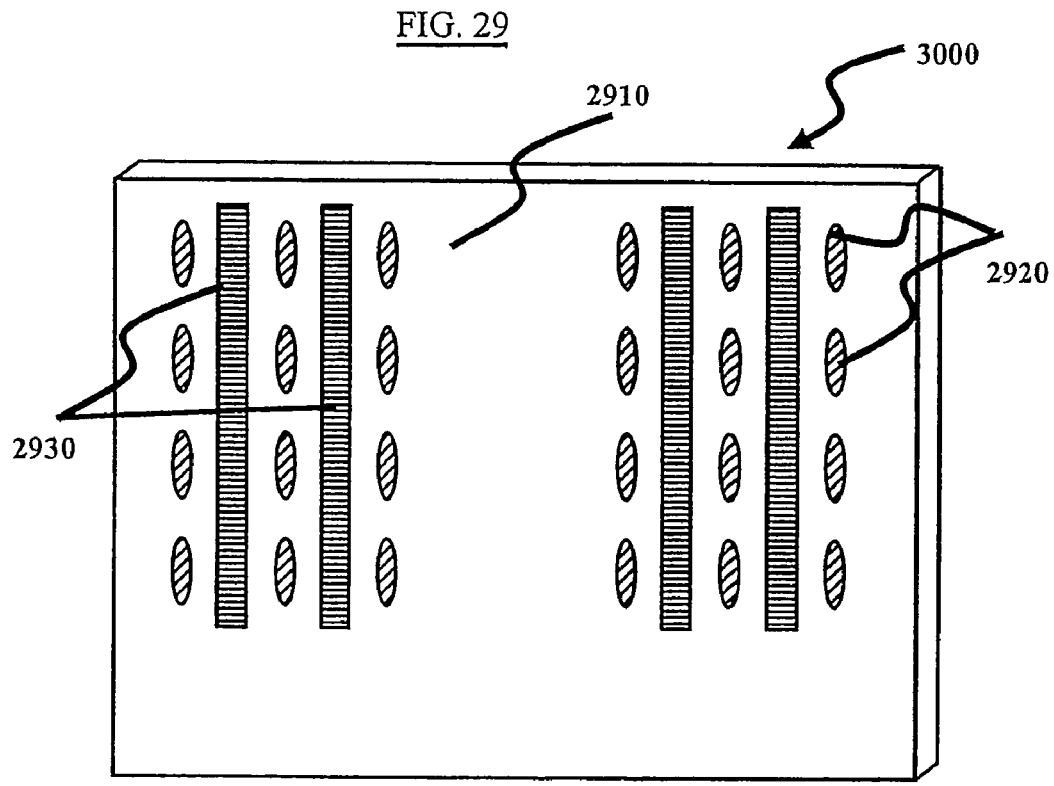

The assembly of the array of slivers is now described with reference to FIGS. 29 to 31. For ease of illustration only, the initial configuration 2900 shows the substrate 2910 with a number of pads of electrical conductive material formed on the substrate. The pads may be an epoxy that is dispensed or printed onto the substrate. The electrically conductive material is used to electrically connect two or more of the elongated semiconductor strips when deposited on the substrate. FIG. 30 illustrates the configuration 3000 where adhesive material is subsequently applied or dispensed on the substrate, preferably as strips 2930, configured between the pads 2920. The adhesive material may also be stamped on the substrate. Alternatively, the adhesive strips may be put on the substrate before the pads of electrically conductive material. The process shown in FIGS. 29 and 30 may be practiced for example where the substrate is pre-printed with electrically conductive material for example. Further, the adhesive material may be applied before or after the electrically conductive material, or vice versa.

Figure 31:
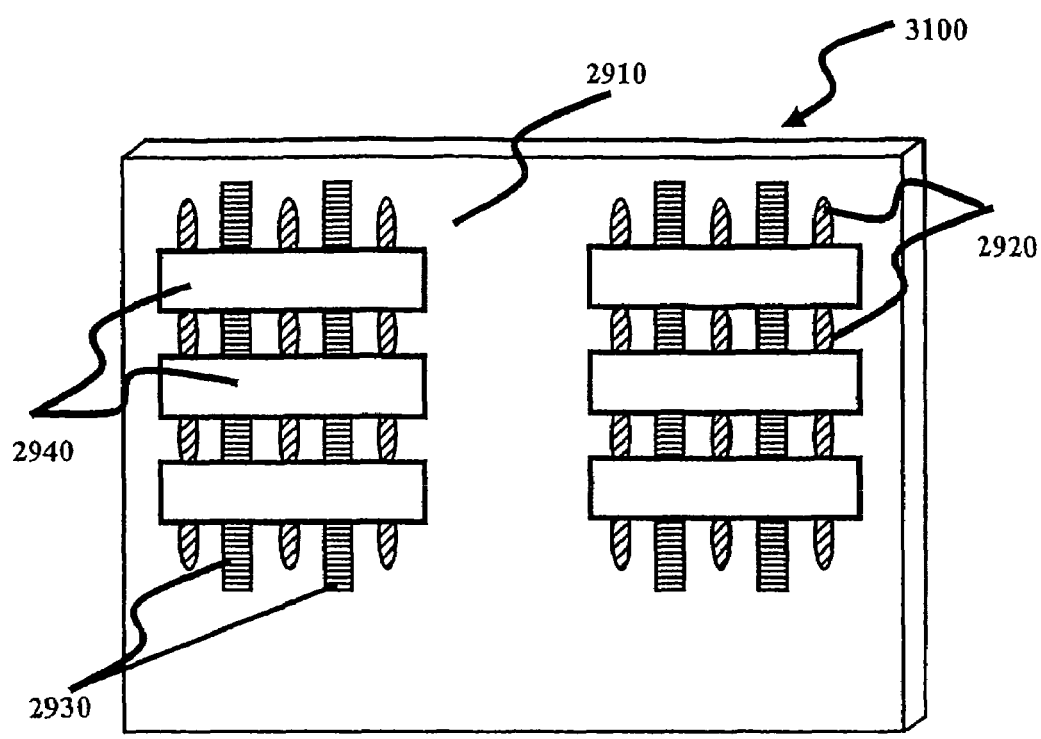

In FIG. 31, the final configuration 3100 shows the slivers 2930 transferred to the substrate using the transfer mechanism 2500, resulting in the strips adhering to the substrate and being electrically interconnected in any of a number manners.

The device shown in FIG. 31 comprises the substrate 2910, an array of elongated semiconductor strips 2940, adhesive material 2930, and electrically conductive material 2920. Again the strips 2940 are separated from a wafer of semiconductor material, and each has a width substantially equal to the wafer thickness and a thickness dimension of the strip 2940 less than the width. The adhesive material 2930 is deposited between the substrate 2910 and a face of each elongated semiconductor strip 2940 to adhere the substrate 2910 and each elongated semiconductor strip 2940 together. The face has the width of the elongated semiconductor strip 2940 as one of its dimensions. The electrically conductive material 2920 is deposited on the substrate 2910 connecting at least two of the elongated semiconductor strips 2940 together. Each elongated semiconductor strip 2940 may comprise a sliver photovoltaic solar cell. Still further, the device is a solar cell module.

The substrate may be glass with a reflective surface on one side so that incident light between the strips in the array is reflected at least partially to the bottom surface of slivers in the array. Still further, the substrate may be a Lambertian reflector. Optical adhesive is preferably used between the slivers and the substrate. Once the electrically conductive connections between strips is formed, an encapsulant may be applied over the array. Metal connections may be used to effect the electrically conductive connections alternatively. A transparent glass plate or other suitable material may then be adhered, for example using adhesive, on top of this encapsulant to form a sandwich like structure with the array of slivers located internally. Dependent upon the spacings of the at least one second belt, the elongated semiconductor strips may be separated by roughly one, two, or three strip widths.

An apparatus for assembling an array of slivers on a substrate utilizes a mechanism for applying adhesive material on the substrate in strips. This may be done by dispensing or stamping the adhesive material, for example. The transfer mechanism 2500 has a vacuum source applying vacuum to each one of the slivers to maintain the strips in the array, the array being a predefined arrangement of the strips. Further, the transferring mechanism is used to transfer the array to the substrate 2910 and bring a face of each sliver into contact with a portion of the adhesive material 2930. The vacuum source 2510 then ceases the vacuum applied to each sliver to provide the array of slivers located in situ on the substrate and adhering to the substrate.

Further aspects of the method of FIG. 34 can be carried out by the apparatus.

Assembling an Array of Slivers on a Substrate

In accordance with another embodiment of the invention, there is provided a method of assembling an array of slivers on a substrate. A sliver is separated from the wafer using vacuum applied to a face of the sliver forming an edge or being adjacent to an edge of the wafer. The wafer is displaced from a source of the vacuum relative by a predetermined distance. The sliver is received on a first pair of parallel belts oriented lengthwise across the belts. The belts are moved in a given direction by a predetermined distance greater than the width of the sliver. These operations are repeatedly carried out until all of the slivers have been processed. The first pair of belts is castellated and has a distance between adjacent castellations substantially wider than the width of the sliver. Each sliver is transferred from the first pair of belts to a second pair of belts using vacuum. The second pair of belts each have castellations with a distance between adjacent castellations greater than the width of an sliver but substantially less than adjacent castellations of the first pair of belts. The second pair of belts are moved in a given direction by a predetermined distance greater than the width of the sliver. This is done in synchronization with the first pair of belts. These operations are carried out until at least a portion of the slivers have been processed forming the array of strips.

The array of slivers is transferred using vacuum, or other well known engagement mechanisms, from the second pair of belts to the substrate having adhesive material applied to a surface of the substrate and bringing a face of each sliver into contact with a portion of the adhesive material. Preferably, the adhesive is optical adhesive and may be stamped on the substrate in strips. Each sliver is released by ceasing the vacuum to provide the array of slivers located in situ on the substrate and adhering to the substrate. The adhesive then hardens; this may be done by ultraviolet (UV) curing the adhesive material. Electrically conductive material is applied to electrically connect two or more of the slivers in the array adhering to the substrate.

The foregoing embodiments of the invention may be practiced with slivers that are 1 mm wide and approximately 110 mm long, for example. In other embodiments, the slivers may be 70 mm or 120 mm in length. The slivers may be used to implement solar cells. The slivers may be separate one from another by gaps of 80 μm to 100 μm. In the first pair of belts, the spacing between castellations may be 3 mm where the slivers are 1 mm wide. Further, slivers are separated by empty spaces on the belt up to 10 mm. The second pair of belts may have adjacent castellations separated by 3 mm. The pitch may be changed to accord with changes in the dimensions of the slivers or other processing requirements. The lifter/referencer may have a spacing of 1.4 mm between adjacent castellations and can be used to adjust the position of the slivers vis-à-vis to within a tolerance of approximately 0.01 mm or thereabout. While specific dimensions have disclosed for the slivers, belts and other assemblies, it will be appreciated by those skilled in the art that adjustments and variations in dimensions dependent upon the application without departing from the scope and spirit of the invention.

Any of a number of other techniques for electrically interconnecting slivers may be applied beside the method of forming pads on the substrate prior to adhesion of the slivers to the substrate. Further in the embodiment shown in FIGS. 29 to 31, dog-bone shaped pads may be used to interconnect rows or blocks of slivers on the substrate.

The embodiments of the invention advantageously utilize vacuum to snap slivers from the wafer. The vacuum concept is well suited for engagement of the sliver on the wafer and to snap the sliver from the wafer without damaging the fragile sliver. The slivers can be inconsistent on the wafer—some are convex, some are concave, some have an "S" shape, some are broken and others may be stuck together with a second sliver.

The method of separating slivers is characterized by:
1. Engaging a sliver by its relatively large and easier to find bottom face.
2. Not relying on precise positioning such as trying to find the small and position variable gap between slivers.
3. Having a generous depth of field of engagement, i.e. engages the sliver even if the sliver is out of position vertically by 1 mm, for example.
4. Not dependent on whether the bottom sliver is joined to the one above that sliver.
5. Not dependent upon whether the bottom sliver is already broken, and
6. Vacuum is robust in a production environment.

Alternative mechanisms to apply vacuum to the sliver are:
a. Use an indexing vacuum drum to which the wafer vertically reciprocates and after engaging a sliver onto the vacuum drum, the vacuum drum and sliver rotate say 10 degrees and be ready for engagement of another sliver. The slivers can be engaged at 12 o'clock and released say at 6 o'clock. This concept has advantages of a rigid indexing drum, ability to release at multiple positions (say 4 o'clock, 6 o'clock and 8 o'clock for grading slivers into multiple grades), but may limit the space to implement a sliver testing function.
b. Use a reciprocating set of vacuum cups or pads to engage the sliver on a fixed (or gross indexing) wafer. This works with either the twin timing belt or the vacuum drum concept, but may have a slower cycle time.
c. Use a vacuum cup or pad on a manipulator (or robot) and pick each sliver and place the sliver either directly on the assembly substrate, a testing station, or into a magazine or temporary holding station. The wafer can be orientated "U" clamp upwards. This method may be slow but can use multiple pickup heads or robots.

As yet another alternative, sticky carrier strip(s) may be used onto which the wafer reciprocates leaving a sliver behind on the strip(s) each time. The sticky strips need some vertical compliance as the position of each sliver's bottom face can vary if the sliver is not straight and flat.

The embodiments of the invention advantageously maintain the orientation of the slivers as removed from the wafer throughout the relevant processing through to assembly of the array on the substrate.

In solar cell applications, the embodiments advantageously reduce the semiconductor (silicon) per watt of output produced.

Figure 42:
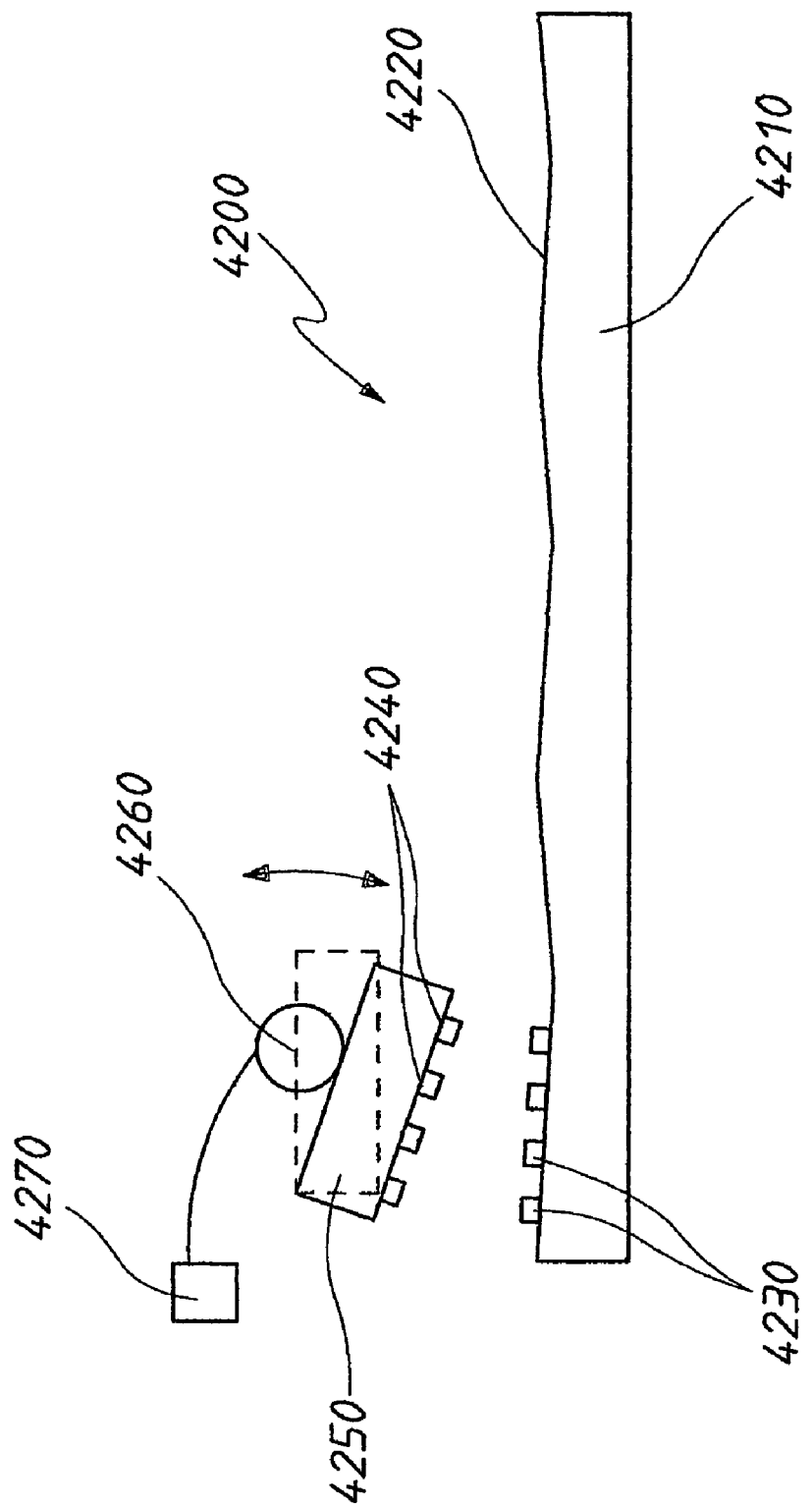
FIG. 42 is a robotic arm capable of rotation for deployment of an arrangement of slivers on an uneven surface.

FIG. 42 is a block diagram illustrating a pivotable, robotic arrangement 4200 for transferring an array of slivers 4240 to an uneven surface substrate 4220. The substrate 4220 may have an uneven (e.g., wavey) surface. Further, the surface (e.g., metal sheet) 4210 that the substrate 4220 is disposed on may also be uneven making the problem worse of transferring the slivers 4240 to the surface. A height sensor 4270 measures changes in the surface of the substrate and is used to rotate a robotic arm 4260 so as to rotate a flexible compliant transfer head 4250 to be better oriented relative to the surface of the substrate. For example, the sensor 4270 may touch the substrate to measure its height and then adjust the head. In this manner, slivers 4240 can be better oriented to the adhesive 4230.

In yet further embodiments, methods of using a vacuum (or mechanical or adhesive tape etc) may be used to transfer the sliver from one belt to another belt (rather than the drum discussed here) or from one belt to container (termed a vacuum transfer belt). The same methods allow slivers to be removed from the container and subsequently processed and therefore slivers can be binned, the manufacturing sequence performed in two sections. Further, methods may be practiced where by the slivers removed from their wafer frame are transferred to belts (or other devices) using the foregoing method.

In the foregoing manner, a number of methods, apparatuses, and systems have been disclosed for separating elongated semiconductor strips from a wafer of semiconductor material, assembling a plurality of elongated semiconductor strips separated from a wafer of semiconductor material into an array of the strips, and assembling an array of elongated semiconductor strips on a substrate. While only a small number of embodiments have been disclosed, it will be apparent to those skilled in the art in the light of this disclosure that numerous changes and substitutions may be made without departing from the scope and spirit of the invention.

We claim:

1. A method of separating elongated semiconductor strips from a wafer of semiconductor material, said method comprising the steps of:

providing a plurality of elongated semiconductor strips formed in a wafer in a substantially parallel manner with respect to each other, said wafer having a substantially planar surface and a thickness dimension at a right angle to the substantially planar surface and a frame portion at opposite ends of said semiconductor strips connecting said strips to said wafer, said semiconductor strips each having a width at least substantially equal to the wafer thickness and a thickness dimension of said strip less than said width, a face of at least one of elongated semiconductor strips lengthwise forming an edge of said wafer or being nearest adjacent said edge;

applying vacuum to said elongated semiconductor strip forming said edge or being adjacent to said edge; and displacing said wafer and a source of said vacuum relative to each other a predetermined distance to separate said elongated semiconductor strip having vacuum applied to said elongated semiconductor strip from said wafer.

2. The method according to claim 1, further comprising the steps of:

at least reducing said vacuum applied to said separated, elongated semiconductor strip; and displacing said separated, elongated semiconductor strip and said source of said vacuum relative to each other.

3. The method according to claim 1, wherein the step of at least reducing said vacuum comprises terminating said vacuum.

4. The method according to claim 1, further comprising the step of:

moving said wafer so that said elongated semiconductor strip is in close proximity to said source of said vacuum.

5. The method according to claim 1, further comprising the step of:

moving said source of said vacuum relative to said wafer so that said source of said vacuum is in close proximity to said elongated semiconductor strip.

6. The method according to claim 1, wherein said steps are repeatedly performed to separate two or more of said plurality of said elongated semiconductor strips from said wafer.

7. The method according to claim 1, wherein said source of said vacuum has a body with at least one cavity formed therein for providing said applied vacuum, said cavity adjacent said elongated semiconductor strip being substantially the same in size as or smaller than a dimension of a face of said elongated semiconductor strip.

8. The method according to claim 1, further comprising the step of:

forming weak points in portions of said wafer adjacent opposite ends of said elongated semiconductor strips to facilitate separation of said elongated semiconductor strip from said wafer.

9. The method according to claim 1, wherein said wafer is single crystal silicon or multicrystalline silicon.

* * * * *